US012088251B2

(12) United States Patent
Sato et al.

(10) Patent No.: US 12,088,251 B2
(45) Date of Patent: Sep. 10, 2024

(54) OSCILLATOR CIRCUIT AND TEMPERATURE COMPENSATION METHOD FOR OSCILLATOR CIRCUIT

(71) Applicant: Asahi Kasei Microdevices Corporation, Tokyo (JP)

(72) Inventors: Takayuki Sato, Tokyo (JP); Takeshi Hamada, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 17 days.

(21) Appl. No.: 18/088,608

(22) Filed: Dec. 25, 2022

(65) Prior Publication Data

US 2023/0231519 A1 Jul. 20, 2023

(30) Foreign Application Priority Data

Jan. 14, 2022 (JP) ................. 2022-004683

(51) Int. Cl.
*H03B 5/04* (2006.01)
*G01K 1/02* (2021.01)
(Continued)

(52) U.S. Cl.
CPC ............... *H03B 5/04* (2013.01); *G01K 1/026* (2013.01); *G05D 23/1931* (2013.01); *H03B 5/362* (2013.01)

(58) Field of Classification Search
CPC .......... H03B 5/04; H03B 5/362; H03B 5/326; H03B 5/32; G01K 1/026; G05D 23/1931
(Continued)

(56) References Cited

U.S. PATENT DOCUMENTS 4,660,057 A * 4/1987 Watanabe .............. G05D 23/20
347/85
7,154,351 B2 12/2006 Kawasaki et al.
(Continued)

FOREIGN PATENT DOCUMENTS

JP     S5643806    4/1981
JP     2010283475  12/2010
(Continued)

*Primary Examiner* — Richard Tan
(74) *Attorney, Agent, or Firm* — JCIPRNET

(57) ABSTRACT

An oscillator circuit includes: a first temperature detector, detecting an internal temperature of the oscillator circuit; a current generator, generating a heater current so that the internal temperature matches a target temperature; a first and second heater, heating the resonator and the integrated circuit, respectively, based on the heater current; a second temperature detector, detecting a temperature of the integrated circuit; a first compensation voltage generation circuit, generating a first compensation voltage for compensating for a frequency variation due to a temperature change in the integrated circuit, based on a detection result of the second temperature detector; a second compensation voltage generation circuit, generating a second compensation voltage for compensating for a frequency variation due to a temperature change in the resonator, based on a detection result of the first temperature detector; and an oscillator, generating an oscillation signal based on the first and second compensation voltages.

19 Claims, 16 Drawing Sheets

(51) Int. Cl.
*G05D 23/19* (2006.01)
*H03B 5/36* (2006.01)

(58) Field of Classification Search
USPC .......................................................... 331/70
See application file for complete search history.

(56) References Cited

U.S. PATENT DOCUMENTS

| | | |
|---|---|---|
| 9,013,244 B2 | 4/2015 | Tokuhashi |
| 10,790,831 B2 | 9/2020 | Aylward |
| 2006/0192626 A1 | 8/2006 | Milliren et al. |
| 2015/0061783 A1 | 3/2015 | Yorita |
| 2018/0278256 A1* | 9/2018 | Hirose .................... H03L 1/022 |
| 2020/0244221 A1 | 7/2020 | Ishikawa et al. |
| 2020/0272179 A1 | 8/2020 | Matsukawa |
| 2021/0250029 A1* | 8/2021 | Matsukawa ............... H03L 1/04 |

FOREIGN PATENT DOCUMENTS

| | | |
|---|---|---|
| JP | 2020120279 | 8/2020 |
| JP | 2021136642 | 9/2021 |

* cited by examiner

OSCILLATOR CIRCUIT AND TEMPERATURE COMPENSATION METHOD FOR OSCILLATOR CIRCUIT

CROSS-REFERENCE TO RELATED APPLICATIONS

This application claims the priority benefit of Japan Application No. 2022-004683, filed on Jan. 14, 2022. The entirety of the above-mentioned patent application is hereby incorporated by reference herein and made a part of this specification.

BACKGROUND

Technical Field

The present disclosure relates to an oscillator circuit and a temperature compensation method for an oscillator circuit.

Related Art

A crystal resonator is known to vary in resonance frequency due to a temperature change. For example, Japanese Patent Laid-Open No. 2013-243629 discloses an oven controlled XTAL oscillator (OCXO) in which a variation in resonance frequency is compensated for by a temperature compensated XTAL oscillator (TCXO) in a region P where an ambient temperature becomes high (70° C. to 100° C.) and a heater is turned off (see FIG. 14).

However, in a conventional oscillator circuit, although it is possible to compensate for a variation in resonance frequency in a region in which an ambient temperature becomes high and a heater is turned off, in a region in which the ambient temperature becomes low and the heater is turned on, a variation in oscillation frequency due to a temperature change in the crystal resonator, or a variation in oscillation frequency due to a temperature change in an integrated circuit caused by a temperature difference from the crystal resonator is not sufficiently compensated for. Hence, a problem arises that frequency stability of the oscillator circuit is low.

SUMMARY

An oscillator circuit according to one embodiment compensates for a frequency variation due to a temperature change in a resonator and an integrated circuit. The oscillator circuit includes: a first temperature detector, detecting an internal temperature of the oscillator circuit; a current generator, generating a heater current so that the internal temperature matches a target temperature; a first heater, heating the resonator based on the heater current; a second heater, heating the integrated circuit based on the heater current; a second temperature detector, detecting a temperature of the integrated circuit; a first compensation voltage generation circuit, generating a first compensation voltage for compensating for a first frequency variation due to a temperature change in the integrated circuit, based on a detection result of the second temperature detector; a second compensation voltage generation circuit, generating a second compensation voltage for compensating for a second frequency variation due to a temperature change in the resonator, based on a detection result of the first temperature detector; and an oscillator, generating an oscillation signal based on the first compensation voltage and the second compensation voltage.

A temperature compensation method for an oscillator circuit according to one embodiment is a temperature compensation method for the following oscillator circuit. The oscillator circuit includes: a first temperature detector, detecting an internal temperature of the oscillator circuit; a current generator, generating a heater current so that the internal temperature matches a target temperature; a first heater, heating the resonator based on the heater current; a second heater, heating the integrated circuit based on the heater current; a second temperature detector, detecting a temperature of the integrated circuit; a first compensation voltage generation circuit, generating a first compensation voltage for compensating for a first frequency variation due to a temperature change in the integrated circuit, based on a detection result of the second temperature detector; a second compensation voltage generation circuit, generating a second compensation voltage for compensating for a second frequency variation due to a temperature change in the resonator, based on a detection result of the first temperature detector; and an oscillator, generating an oscillation signal based on the first compensation voltage and the second compensation voltage. The temperature compensation method includes the following steps. By the current generator, the heater current is generated so that the internal temperature matches the target temperature in a heater-on region and at an ambient temperature that is constant. A resistance value of a variable resistance of the second heater is set to a first resistance value and the temperature of the integrated circuit is detected. The resistance value of the variable resistance of the second heater is set to a second resistance value less than the first resistance value and the temperature of the integrated circuit is detected. By the first compensation voltage generation circuit, the first compensation voltage for compensating for the first frequency variation is generated based on the temperature of the integrated circuit at which the resistance value is the first resistance value and the temperature of the integrated circuit at which the resistance value is the second resistance value. By the second compensation voltage generation circuit, the second compensation voltage for compensating for the second frequency variation is generated based on a change in the second frequency variation with respect to the internal temperature in a heater-off region and at the ambient temperature that is changing. By the current generator, the target temperature is generated so as to compensate for the second frequency variation with respect to the ambient temperature in the heater-on region and at the ambient temperature that is changing.

DESCRIPTION OF THE EMBODIMENTS

Figure 1:
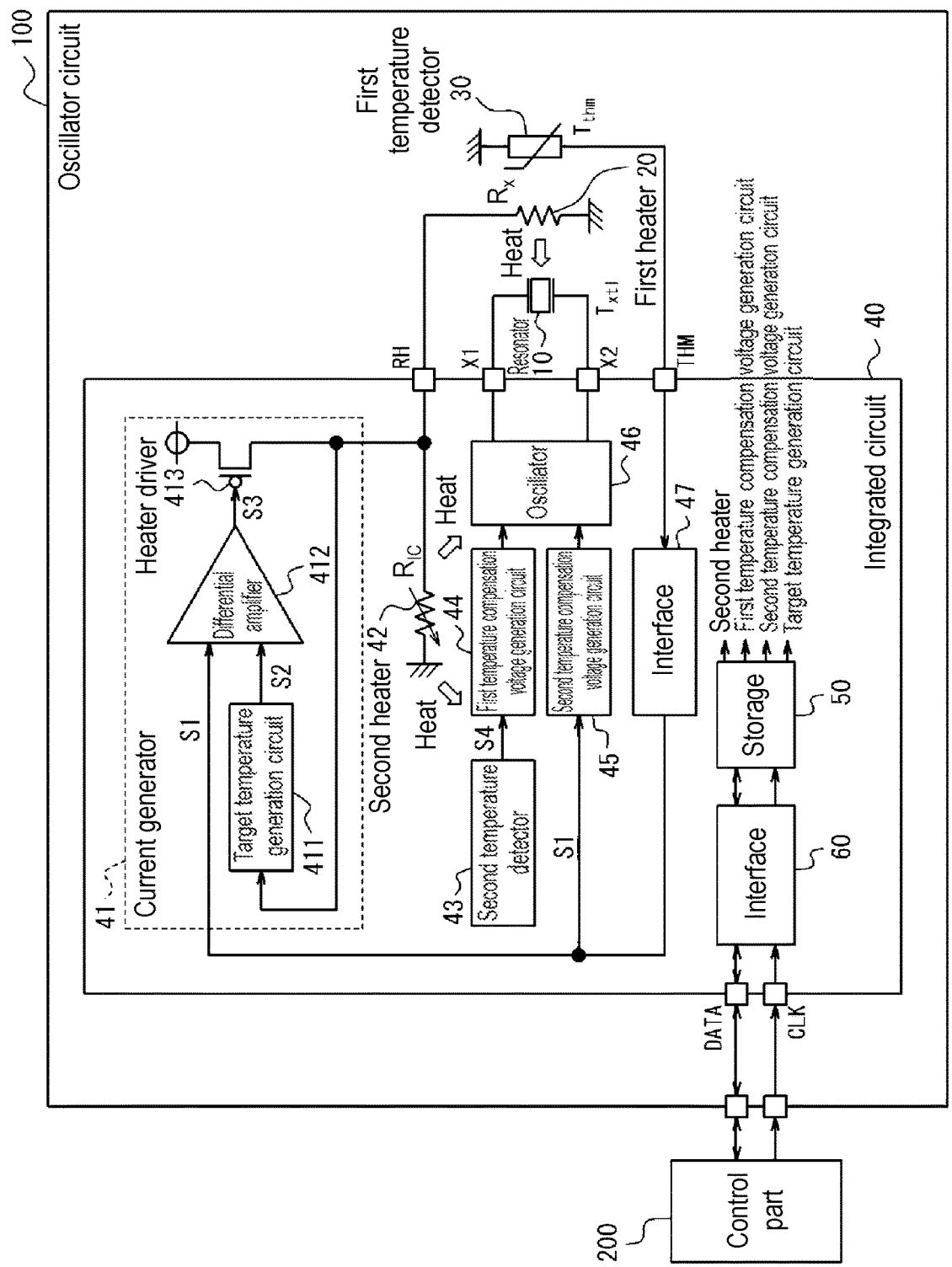
FIG. 1 illustrates an example of a configuration of an oscillator circuit according to a first embodiment.

The present disclosure provides an oscillator circuit having high frequency stability.

Hereinafter, an embodiment of the disclosure will be described in detail with reference to the drawings. In principle, the same components are given the same reference numerals, and repeated description is omitted.

In this specification, the term "zero" not only means substantially zero but may include a numerical range of approximately zero close to substantially zero.

In this specification, the term "ambient temperature" means an atmospheric temperature around an oscillator circuit. The term "target temperature" means a temperature aimed at when controlling an internal temperature of an oscillator circuit by heating using a heater. The term "boundary temperature" means a temperature at a boundary between a heater-on region and a heater-off region. The term "heater-on region" means a region in which a heater is turned on, which is a region in which an ambient temperature is equal to or lower than a boundary temperature. The term "heater-off region" means a region in which a heater is turned off, which is a region in which an ambient temperature is higher than a boundary temperature. However, these terms are defined for convenience only and should not be construed as limiting.

First Embodiment

[Oscillator Circuit]

An example of a configuration of an oscillator circuit 100 according to a first embodiment is described with reference to FIG. 1 to FIG. 6.

The oscillator circuit 100 is a circuit that compensates for a frequency variation due to a temperature change in a resonator 10 and an integrated circuit 40. In this specification, a frequency variation due to a temperature change in the resonator 10 is represented by $\Delta F_{xt1}$ [ppm]. A frequency variation due to a temperature change in the integrated circuit 40 is represented by $\Delta F_{IC}$ [ppm]. The total of frequency variations in the oscillator circuit 100 is represented by $\Delta F_{total}$ [ppm]. A temperature compensation component is represented by $\Delta F_C$ [ppm].

Figure 2:
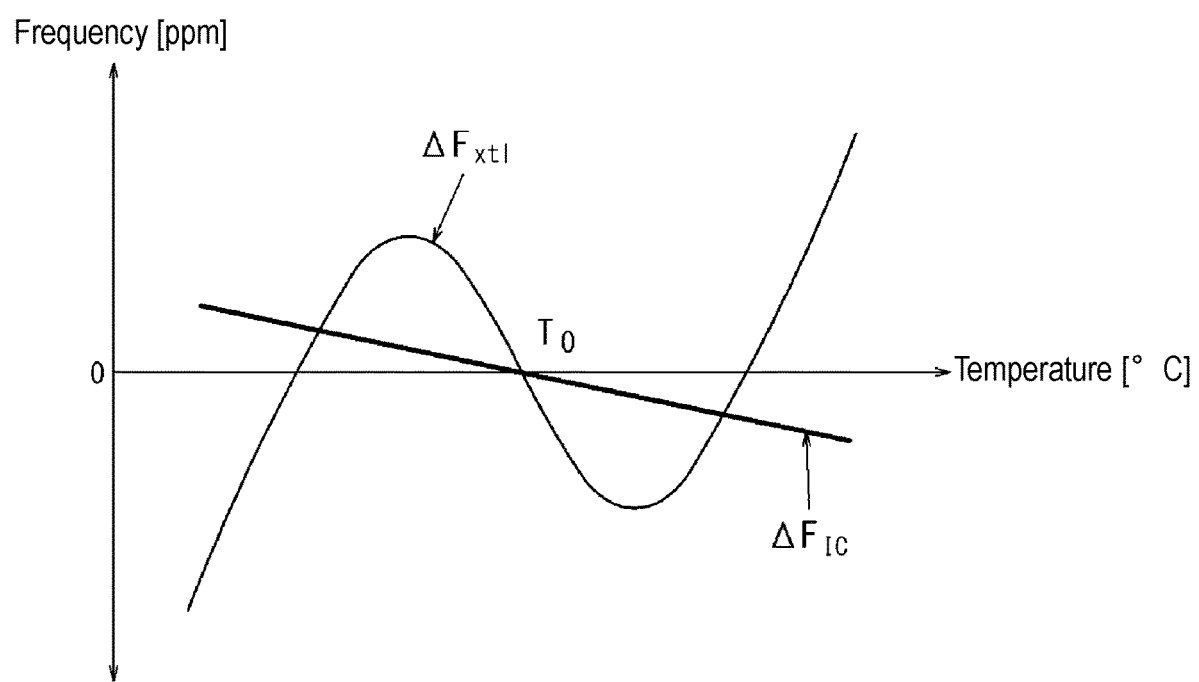
FIG. 2 illustrates an example of a relationship between temperature and frequency variation due to a temperature change in a resonator and a relationship between temperature and frequency variation due to a temperature change in an integrated circuit according to the first embodiment.

The frequency variation $\Delta F_{xt1}$ [ppm] due to a temperature change in the resonator 10 is expressed by a cubic function as follows in the case where, for example, the resonator 10 is a crystal resonator (see FIG. 2).

$$\Delta F_{xt1} = A_{3x}(T_{xt1}-T_0)^3 + A_{2x}(T_{xt1}-T_0)^2 + A_{1x}(T_{xt1}-T_0)^1 \tag{1}$$

$T_{xt1}$ is a temperature [° C.] of the resonator 10. $A_{3x}$ is a third order frequency variation coefficient [ppm/° C.³] of a temperature variation factor of the resonator 10. $A_{2x}$ is a second order frequency variation coefficient [ppm/° C.²] of a temperature variation factor of the resonator 10. $A_{1x}$ is a first order frequency variation coefficient [ppm/° C.] of a temperature variation factor of the resonator 10. To is a reference temperature [° C.] for normalizing $\Delta F_{xt1}$ [ppm] to 0.

The frequency variation $\Delta F_{IC}$ [ppm] due to a temperature change in the integrated circuit 40 can be approximated by a linear function as follows (see FIG. 2).

$$\Delta F_{IC} \approx A_{1i}(T_{IC}-T_0)^1 \tag{2}$$

$T_{IC}$ is a temperature [° C.] of the integrated circuit 40. $A_{1i}$ is a first order frequency variation coefficient [ppm/° C.] of a temperature variation factor of the integrated circuit 40. $T_0$ is a reference temperature [° C.] for normalizing $\Delta F_{IC}$ [ppm] to 0.

The total $\Delta F_{total}$ [ppm] of frequency variations in the oscillator circuit 100 after temperature compensation is expressed by the following equation.

$$\Delta F_{total} = \Delta F_{xt1} + \Delta F_{IC} - \Delta F_C = 0 \tag{3}$$

The oscillator circuit 100 includes the resonator 10, a first heater 20, a first temperature detector (such as a temperature sensor) 30, and the integrated circuit 40. The oscillator circuit 100 is connected via an input/output terminal DATA and an input terminal CLK to a control part 200 provided outside the oscillator circuit 100.

The integrated circuit 40 includes a current generator 41, a second heater 42, a second temperature detector (such as a temperature sensor) 43, a first temperature compensation voltage generation circuit 44, a second temperature compensation voltage generation circuit 45, an oscillator 46, an interface 47, a storage 50, and an interface 60. The integrated circuit 40 may also additionally include a test path for monitoring by a temperature detector. The integrated circuit 40 is connected to the first heater 20 via a terminal RH, and is connected to the first temperature detector 30 via a terminal THM.

The resonator 10 may be, for example, an SC-cut crystal resonator, an AT-cut crystal resonator, a microelectromechanical systems (MEMS) resonator, or a ceramic resonator. The resonator 10 is connected to the oscillator 46 via a connecting terminal X1 and a connecting terminal X2.

The first heater 20 heats the resonator 10 based on a heater current supplied from the current generator 41. The first heater 20 is preferably provided in close proximity to the resonator 10. The first heater 20 has one end connected to the ground and the other end connected to the second heater 42 and the current generator 41 via the terminal RH. The first heater 20 may be, for example, a heater resistor having a resistance $R_x$.

The first temperature detector 30 detects an internal temperature $T_{thm}$ of the oscillator circuit 100. The first temperature detector 30 is preferably provided in close proximity to the resonator 10. The first temperature detector 30 has one end connected to the ground and the other end connected to the interface 47 via the terminal THM. The first temperature detector 30 may be, for example, a thermistor whose resistance value changes with temperature, a platinum resistance element, or a thermocouple whose potential changes with temperature.

The interface 47 is provided between the first temperature detector 30 and the current generator 41 and between the first temperature detector 30 and the second temperature compensation voltage generation circuit 45. For example, the interface 47 converts a resistance value input from the first temperature detector 30 via the terminal THM into a voltage signal, generates data (for example, a voltage signal) S1 indicating the internal temperature $T_{thm}$ of the oscillator circuit 100, and outputs the same to the current generator 41 and the second temperature compensation voltage generation circuit 45.

The current generator 41 includes a target temperature generation circuit 411, a differential amplifier 412 and a heater driver 413. Based on the data S1 indicating the internal temperature $T_{thm}$ of the oscillator circuit 100 input from the interface 47, the current generator 41 generates a heater current (of, for example, about several hundred mA) so that the internal temperature $T_{thm}$ of the oscillator circuit 100 matches a target temperature $T_{gt}$. The current generator 41 supplies the heater current to the first heater 20 and the second heater 42. The target temperature $T_{gt}$ is preferably set to a temperature about 15° C. higher than an ambient temperature Ta. For example, in the case where the ambient temperature Ta is about 105° C., the target temperature $T_{gt}$ may be set to about 120° C.

The target temperature generation circuit 411 generates the target temperature $T_{gt}$ based on a voltage Vh at the terminal RH that represents the ambient temperature Ta. The target temperature generation circuit 411 generates data (for example, a voltage signal) S2 indicating the target temperature $T_{gt}$, and outputs the same to the differential amplifier 412. The target temperature generation circuit 411 may be, for example, an approximate N-th order function generation circuit, an approximate hyperbolic function generation circuit, or an approximate sigmoid function generation circuit. Details of the approximate N-th order function generation circuit can be found in Japanese Patent No. 4070139. Details of the approximate hyperbolic function generation circuit and the approximate sigmoid function generation circuit can be found in U.S. Pat. No. 10,790,831.

For example, in a heater-on region and at the ambient temperature Ta that is changing, the target temperature generation circuit 411 generates the target temperature $T_{gt}$ (=internal temperature $T_{thm}$ of the oscillator circuit 100) so that the total $\Delta F_{total}$ (=$\Delta F_{xt1}+\Delta F_{IC}-\Delta F_C$) of frequency variations in the oscillator circuit 100 with respect to the ambient temperature Ta becomes zero.

Figure 3A:
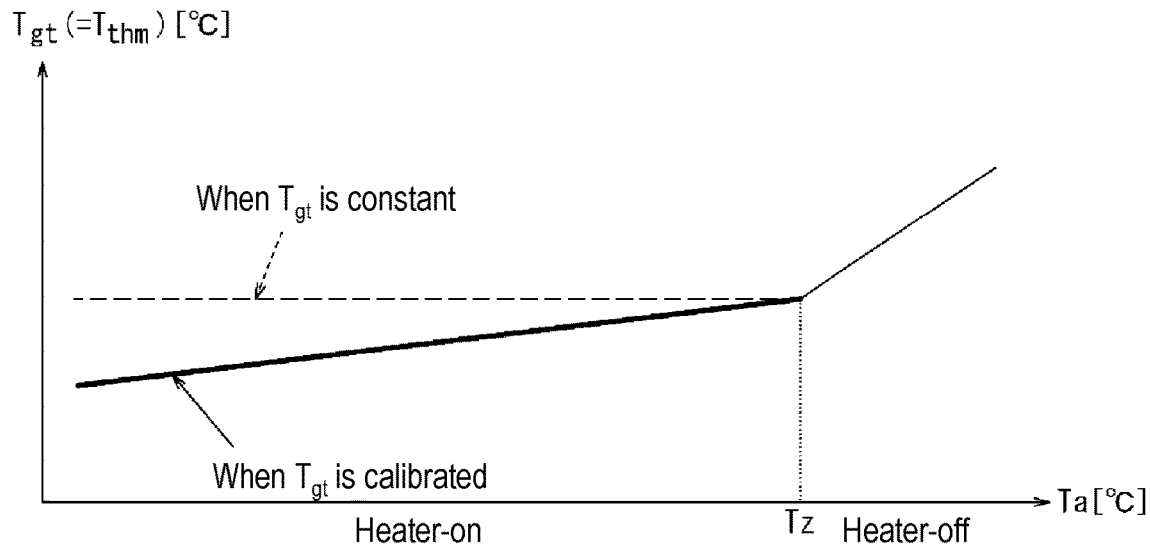
FIG. 3A illustrates an example of a relationship between ambient temperature and target temperature according to the first embodiment.
Figure 3B:
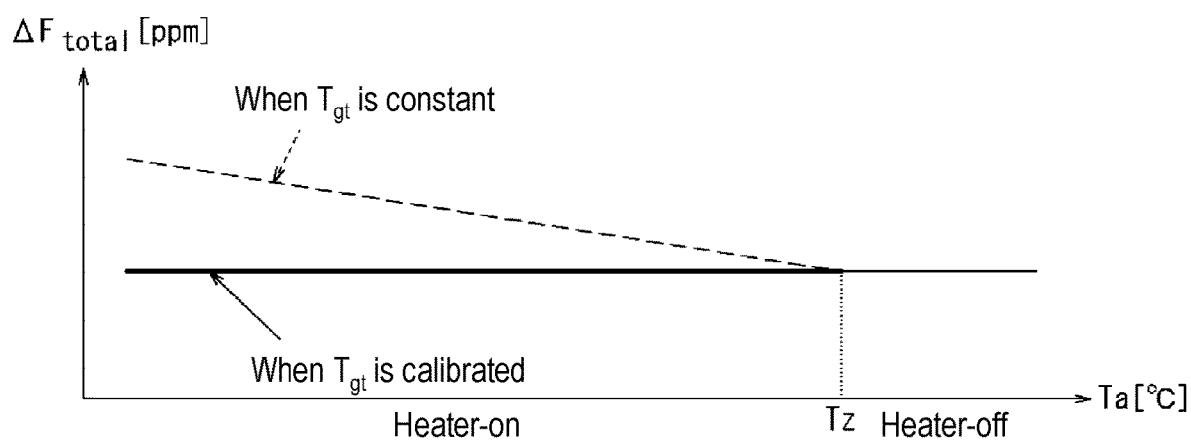
FIG. 3B illustrates an example of a relationship between ambient temperature and the total of frequency variations in the oscillator circuit according to the first embodiment.

Data indicating a relationship between the ambient temperature Ta and the target temperature $T_{gt}$ in the case where the target temperature $T_{gt}$ is calibrated so that the total $\Delta F_{total}$ of frequency variations in the oscillator circuit 100 becomes zero as shown in FIG. 3A is stored in the storage 50. Data indicating a relationship between the ambient temperature Ta and the total $\Delta F_{total}$ of frequency variations in the oscillator circuit 100 in the case where the target temperature $T_{gt}$ is calibrated so that the total $\Delta F_{total}$ of frequency variations in the oscillator circuit 100 becomes zero as shown in FIG. 3B is stored in the storage 50.

By appropriately calibrating the target temperature $T_{gt}$, in the heater-on region and at the ambient temperature Ta that is changing, while both the temperature $T_{xt1}$ of the resonator 10 and the internal temperature $T_{thm}$ of the oscillator circuit 100 change, the total $\Delta F_{total}$ of frequency variations in the oscillator circuit 100 can be made zero.

Figure 4A:
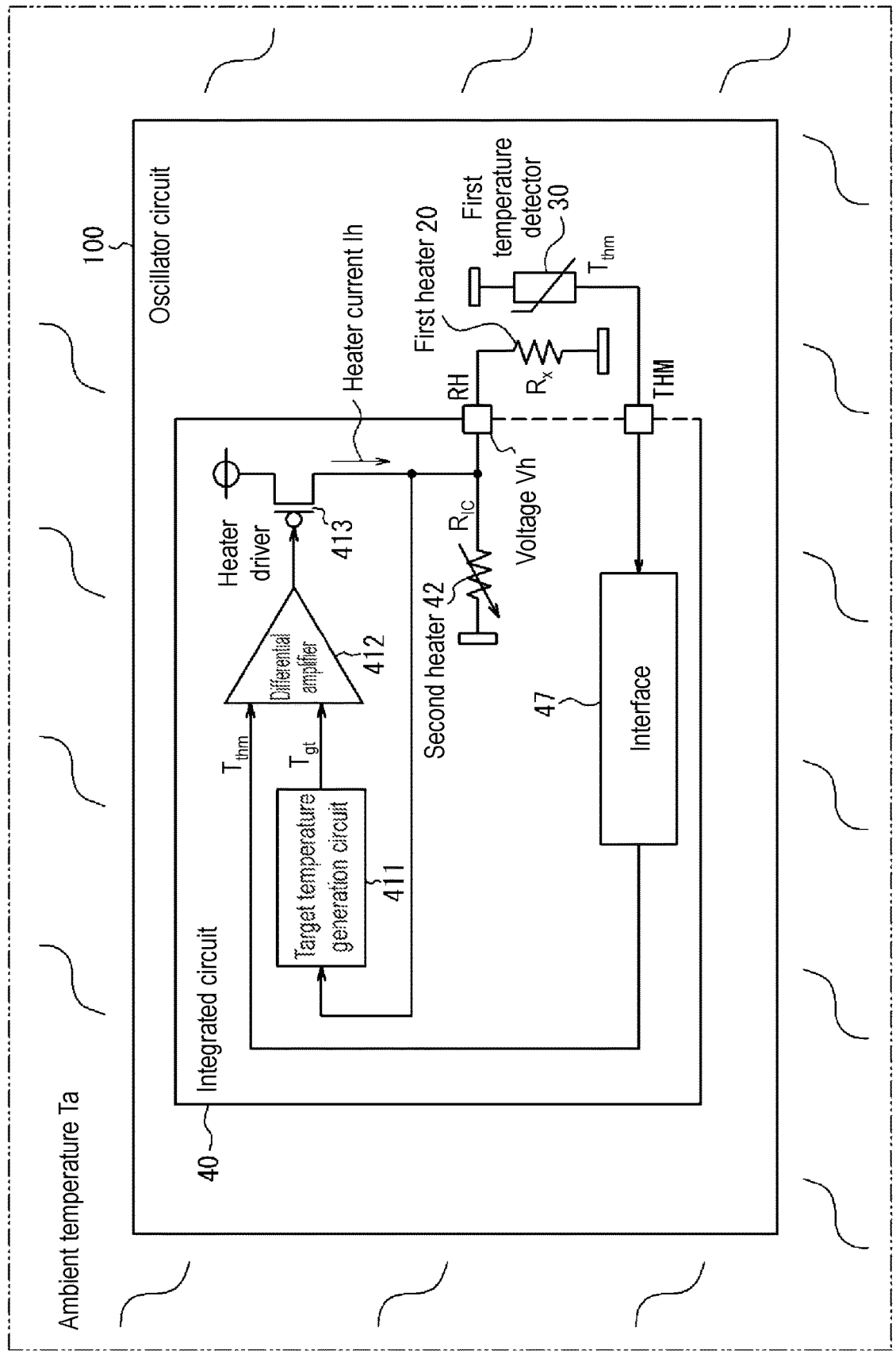
FIG. 4A illustrates an example of a configuration of a temperature control circuit in the oscillator circuit according to the first embodiment.
Figure 4B:
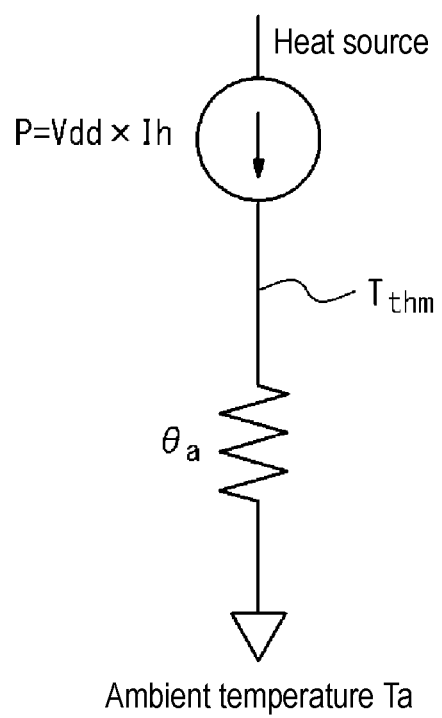
FIG. 4B illustrates an example of a thermal resistance model according to the first embodiment.

Here, a reason why the voltage Vh at the terminal RH represents the ambient temperature Ta is briefly described with reference to FIG. 4A and FIG. 4B.

Internal power P [W] of the oscillator circuit 100 is the product of a power supply voltage Vdd [V] and a sum Ih [A] of the heater current supplied from the current generator 41 to the first heater 20 and the heater current supplied from the current generator 41 to the second heater 42. Hence, referring to a thermal resistance model, the following equation is established.

$$T_{thin}-Ta=\theta a \times Ih \times Vdd \qquad (4)$$

θa is a thermal resistance [° C./W] from the first temperature detector 30 toward the ambient temperature Ta.

Here, the sum Ih of the heater current supplied from the current generator 41 to the first heater 20 and the heater current supplied from the current generator 41 to the second heater 42 may be expressed by the following equation using the resistance $R_x$ of the first heater 20, a variable resistance $R_{IC}$ of the second heater 42, and the voltage Vh at the terminal RH.

$$Ih = \frac{R_x + R_{IC}}{R_x \times R_{IC}} Vh \qquad (5)$$

When Ih is eliminated and Vh is solved from equations (4) and (5), the following equation is established.

$$Vh = \frac{R_x \times R_{IC}}{(R_x + R_{IC}) \times \theta a \times Vdd}(T_{thm} - Ta) \qquad (6)$$

It is known from equation (6) that the voltage Vh at the terminal RH is a linear expression of the ambient temperature Ta. That is, it is known that the fact that the target temperature generation circuit 411 generates the target temperature $T_{gt}$ based on the voltage Vh at the terminal RH is equivalent to the fact that the target temperature generation circuit 411 generates the target temperature $T_{gt}$ based on the ambient temperature Ta.

The target temperature generation circuit 411 may not only generate a first order target temperature $T_{gt}$ with respect to the voltage Vh at the terminal RH, but may also generate an N (N≥1)-th order target temperature $T_{gt}$ with respect to the voltage Vh at the terminal RH.

The differential amplifier 412 amplifies a difference between the data S1 indicating the internal temperature $T_{thm}$ of the oscillator circuit 100 input from the interface 47 and the data S2 indicating the target temperature $T_{gt}$ input from the target temperature generation circuit 411, and generates an amplified signal (for example, a voltage signal) S3. The differential amplifier 412 outputs the amplified signal S3 to the heater driver 413.

Based on the amplified signal S3 input from the differential amplifier 412, the heater driver 413 generates a heater current and supplies the heater current to the first heater 20 and the second heater 42.

For example, the heater driver 413 supplies the heater current to the first heater 20 and the second heater 42 in the case of turning on the first heater 20 and the second heater 42. In this case, the first heater 20 and the second heater 42 generate heat.

For example, the heater driver 413 does not supply the heater current to the first heater 20 and the second heater 42 in the case of turning off the first heater 20 and the second heater 42. In this case, the first heater 20 and the second heater 42 do not generate heat. A means of turning off a heater may be, for example, setting an output current of the heater driver 413 to zero, or adding a switch to a current path of the first heater 20 and the second heater 42 and turning off the switch.

The second heater 42 heats the integrated circuit 40 based on the heater current supplied from the current generator 41. The second heater 42 is preferably built in or provided in close proximity to the integrated circuit 40. The second heater 42 has one end connected to the ground and the other end connected to the current generator 41 via the terminal RH. The second heater 42 may be, for example, a heater resistor having a variable resistance $R_{IC}$ whose resistance value changes.

The resistance value of the variable resistance $R_{IC}$ is not particularly limited, and may be set to any value by the control part 200. The resistance value of the variable resistance $R_{IC}$ is stored in the storage 50. As the resistance value of the variable resistance $R_{IC}$ changes, a distribution ratio of power distributed to the resonator 10 and the integrated circuit 40 also changes.

Figure 5A:
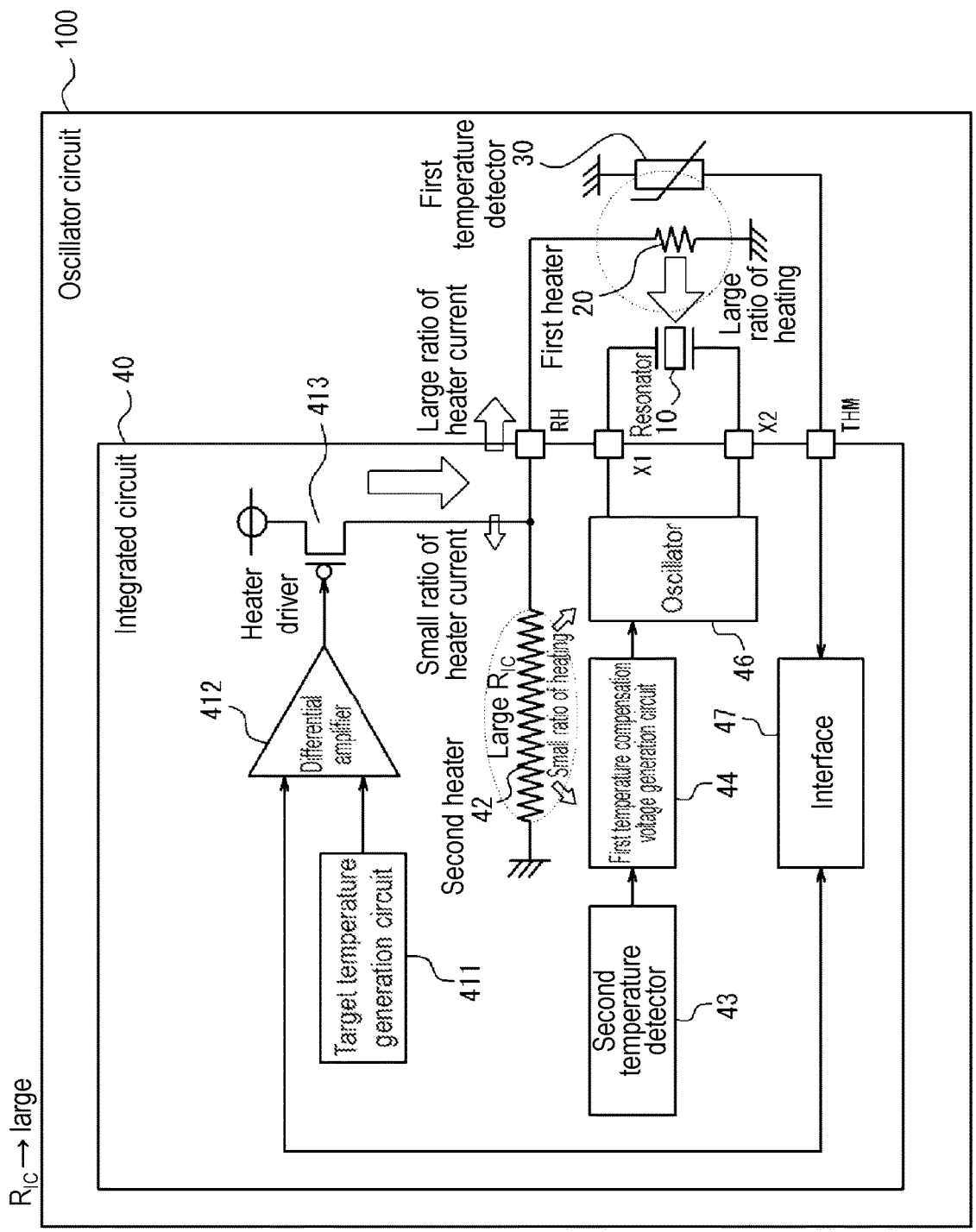
FIG. 5A illustrates an example of a configuration of the oscillator circuit according to the first embodiment.

For example, as shown in FIG. 5A, in the case where the resistance value of the variable resistance $R_{IC}$ is set to a large value (for example, about 20Ω) while the ambient temperature Ta is constant, a ratio of the heater current supplied from the current generator 41 to the second heater 42 is small compared to a ratio of the heater current supplied from the current generator 41 to the first heater 20. A ratio (for example, 30%) in which the second heater 42 heats the integrated circuit 40 is small compared to a ratio (for example, 70%) in which the first heater 20 heats the resonator 10. In this case, in the oscillator circuit 100, temperature control can be performed so as to lower the temperature $T_{IC}$ of the integrated circuit 40 while causing the internal temperature $T_{thm}$ of the oscillator circuit 100 and the temperature $T_{xt1}$ of the resonator 10 to match the target temperature $T_{gt}$.

Figure 5B:
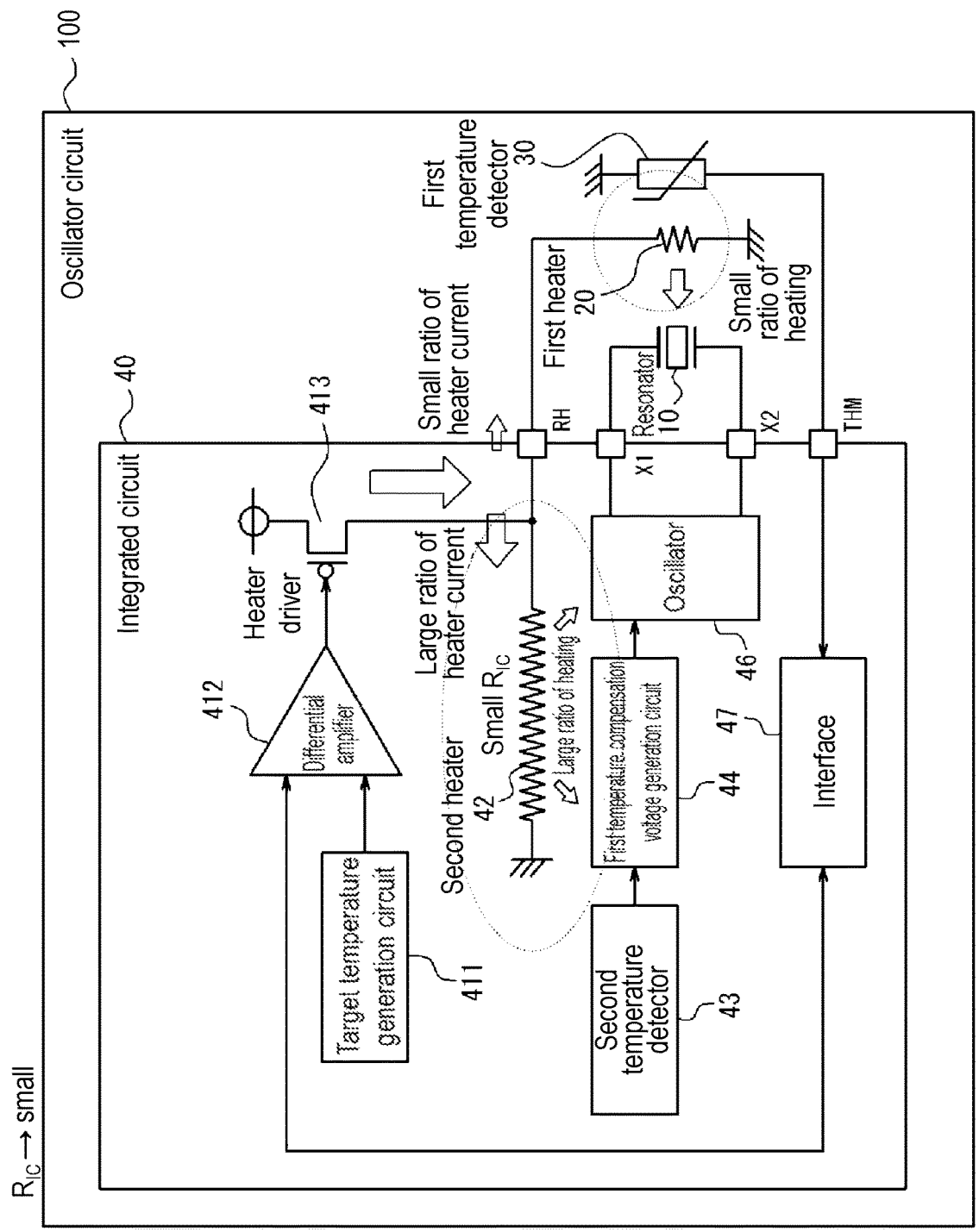
FIG. 5B illustrates an example of a configuration of the oscillator circuit according to the first embodiment.

For example, as shown in FIG. 5B, in the case where the resistance value of the variable resistance $R_{IC}$ is set to a small value (for example, about 3.7Ω) while the ambient temperature Ta is constant, a ratio of the heater current supplied from the current generator 41 to the second heater 42 is large compared to a ratio of the heater current supplied from the current generator 41 to the first heater 20. A ratio (for example, 70%) in which the second heater 42 heats the integrated circuit 40 is large compared to a ratio (for example, 30%) in which the first heater 20 heats the resonator 10. In this case, in the oscillator circuit 100, temperature control can be performed so as to raise the temperature $T_{IC}$ of the integrated circuit 40 while causing the internal temperature $T_{thm}$ of the oscillator circuit 100 and the temperature $T_{xt1}$ of the resonator 10 to match the target temperature $T_{gt}$.

That is, in the oscillator circuit 100, by appropriately changing the resistance value of the variable resistance $R_{IC}$ of the second heater 42, in the heater-on region and at the ambient temperature Ta that is constant, the temperature $T_{IC}$ of the integrated circuit 40 can be greatly changed while the temperature $T_{xt1}$ of the resonator 10 remains substantially unchanged. Accordingly, in the oscillator circuit 100, a temperature compensation component can be generated so as to independently compensate only for the frequency variation $\Delta F_{IC}$ due to a temperature change in the integrated circuit 40 out of $\Delta F_{total}$ (=$\Delta F_{xt1}+\Delta F_{IC}$).

The second temperature detector 43 detects the temperature $T_{IC}$ of the integrated circuit 40. The second temperature detector 43 is preferably built in or provided in close proximity to the integrated circuit 40. The second temperature detector 43 generates data (for example, a voltage signal) S4 indicating the temperature $T_{IC}$ of the integrated circuit 40, and outputs the same to the first temperature compensation voltage generation circuit 44. The second temperature detector 43 may be, for example, a known temperature sensor.

Based on the temperature $T_{IC}$ (detection result of the second temperature detector 43) of the integrated circuit 40 input from the second temperature detector 43, the first temperature compensation voltage generation circuit 44 generates a first compensation voltage $V_1$ being a temperature compensation component for compensating for the frequency variation $\Delta F_{IC}$ due to a temperature change in the integrated circuit 40. The first temperature compensation voltage generation circuit 44 outputs the first compensation voltage $V_1$ to the oscillator 46.

For example, in the heater-on region and at the ambient temperature Ta that is constant, the first temperature compensation voltage generation circuit 44 acquires data indicating a frequency $F_1$ of an oscillation signal in the oscillator 46 actually measured, the data S1 indicating an internal temperature $T_{thm1}$ of the oscillator circuit 100 detected by the first temperature detector 30, and the data S4 indicating a temperature $T_{IC1}$ of the integrated circuit 40 detected by the second temperature detector 43 in the case where the resistance value of the variable resistance $R_{IC}$ of the second heater 42 is set to a large value. The frequency $F_1$ of the oscillation signal in the oscillator 46 is expressed by the following equation using a first order temperature coefficient α with respect to the temperature $T_{IC1}$ of the integrated circuit 40 and a first order temperature coefficient β with respect to the temperature $T_{xt1}$ of the resonator 10.

$$F_1 = \alpha \cdot T_{IC1} + \beta \cdot T_{thm1} \text{(wherein } T_{thm1} \approx T_{xt11}) \quad (7)$$

For example, in the heater-on region and at the ambient temperature Ta that is constant, the first temperature compensation voltage generation circuit 44 acquires data indicating a frequency $F_2$ of an oscillation signal in the oscillator 46 actually measured, the data S1 indicating an internal temperature $T_{thm2}$ of the oscillator circuit 100 detected by the first temperature detector 30, and the data S4 indicating a temperature $T_{IC2}$ of the integrated circuit 40 detected by the second temperature detector 43 in the case where the resistance value of the variable resistance $R_{IC}$ of the second heater 42 is set to a small value. The frequency $F_2$ of the oscillation signal in the oscillator 46 is expressed by the following equation using the first order temperature coefficient α with respect to the temperature $T_{IC2}$ of the integrated circuit 40 and the first order temperature coefficient β with respect to the temperature $T_{xt12}$ of the resonator 10.

$$F_2 = \alpha T_{IC2} + \beta T_{thm2} \text{(wherein } T_{thm2} \approx T_{xt12}) \quad (8)$$

When the resistance value of the variable resistance $R_{IC}$ of the second heater 42 is switched to a large value or a small value, since a change in the internal temperature $T_{thm}$ of the oscillator circuit 100 is very small, the frequency variation $\Delta F_{xt1}$ due to a temperature change in the resonator 10 can be approximated to be first order. Accordingly, the first order temperature coefficient α with respect to the temperature $T_{IC}$ of the integrated circuit 40 is expressed by the following equation by solving simultaneous equations of equations (7) and (8).

$$\alpha = \frac{F_1 T_{thm2} - F_2 T_{thm1}}{T_{IC1} T_{thm2} - T_{IC2} T_{thm1}} \quad (9)$$

Based on equation (9), the first temperature compensation voltage generation circuit 44 calculates the first order temperature coefficient α with respect to the temperature $T_{IC}$ of the integrated circuit 40, and generates the first compensation voltage $V_1$ for compensating for ($\Delta F_{IC}=0$) the frequency variation $\Delta F_{IC}$ due to a temperature change in the integrated circuit 40. Accordingly, the frequency variation $\Delta F_{IC}$ due to a temperature change in the integrated circuit 40 may be optimally adjusted.

The switching of the resistance value of the variable resistance $R_{IC}$ of the second heater 42 is not limited to two kinds, but may be N (N≥2) kinds. In the case of N kinds, the first temperature compensation voltage generation circuit 44 may calculate an N-th order temperature coefficient $\alpha_N$ with respect to the temperature $T_{IC}$ of the integrated circuit 40, and may generate the first compensation voltage $V_1$ for compensating for the frequency variation $\Delta F_{IC}$ due to a temperature change in the integrated circuit 40.

Based on the data S1 indicating the internal temperature $T_{thm}$ (detection result of the first temperature detector 30) of the oscillator circuit 100 input from the interface 47, the second temperature compensation voltage generation circuit 45 generates a second compensation voltage $V_2$ being a temperature compensation component for compensating for the frequency variation $\Delta F_{xt1}$ due to a temperature change in the resonator 10. The second temperature compensation voltage generation circuit 45 outputs the second compensation voltage $V_2$ to the oscillator 46.

Figure 6:
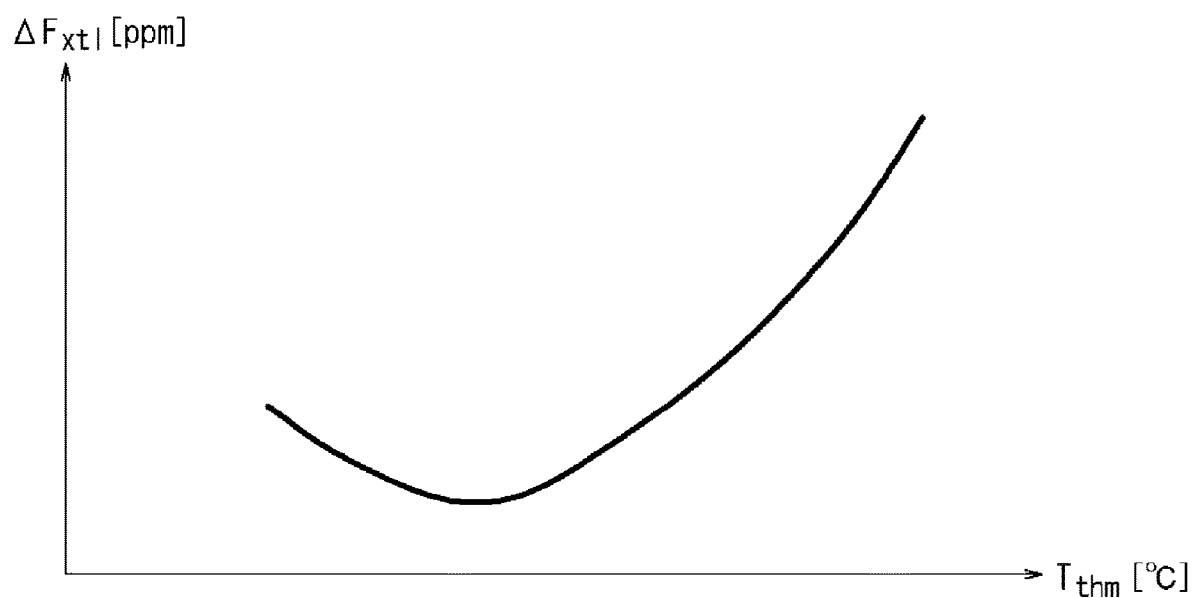
FIG. 6 illustrates an example of a relationship between internal temperature of the oscillator circuit and frequency variation due to a temperature change in the resonator according to the first embodiment.

For example, in a heater-off region and at the ambient temperature Ta that is changing, the second temperature compensation voltage generation circuit 45 acquires data indicating a frequency F of an oscillation signal in the oscillator 46 actually measured before temperature compensation, the data S1 indicating the internal temperature $T_{thm}$ of the oscillator circuit 100 detected by the first temperature detector 30, and data (see FIG. 6) indicating a relationship between the internal temperature $T_{thm}$ of the oscillator circuit 100 and the frequency variation $\Delta F_{xt1}$ due to a temperature change in the resonator 10. Then, the second temperature compensation voltage generation circuit 45 generates a temperature compensation component $\Delta F_C$ expressed by the following equation. The data indicating the relationship between the internal temperature $T_{thm}$ of the oscillator circuit 100 and the frequency variation $\Delta F_{xt1}$ due to a temperature change in the resonator 10 as shown in FIG. 6 is stored in the storage 50.

$$\Delta F_C = B_3(T_{thm}-T_0)^3 + B_2(T_{thm}-T_0)^2 + B_1(T_{thm}-T_0)^1 \quad (10)$$

Based on equation (10), the second temperature compensation voltage generation circuit 45 generates the second compensation voltage $V_2$ for compensating for ($\Delta F_{xt1}=0$) the frequency variation $\Delta F_{xt1}$ due to a temperature change in the resonator 10. Accordingly, the frequency variation $\Delta F_{xt1}$ due to a temperature change in the resonator 10 may be optimally adjusted.

Based on the first compensation voltage $V_1$ input from the first temperature compensation voltage generation circuit 44 or the second compensation voltage $V_2$ input from the second temperature compensation voltage generation circuit 45, the oscillator 46 generates an oscillation signal for causing the resonator 10 to oscillate. The oscillator 46 is an oscillator that changes an oscillation frequency according to a voltage supplied, and may be, for example, a voltage controlled XTAL oscillator (VCXO). By the oscillator 46 generating the oscillation signal based on the first compensation voltage $V_1$ input from the first temperature compensation voltage generation circuit 44 or the second compensation voltage $V_2$ input from the second temperature compensation voltage generation circuit 45, the oscillator circuit 100 is able to output the oscillation signal having a highly accurate oscillation frequency by which the frequency variation due to a temperature change in the resonator 10 and the integrated circuit 40 is compensated for.

The storage 50 may be, for example, a non-volatile memory or a one-time memory. The storage 50 may store, for example, the resistance value of the variable resistance $R_{IC}$ of the second heater 42 and the voltage Vh at the terminal RH. The storage 50 may store, for example, the data indicating the relationship between the ambient temperature Ta and the target temperature $T_{gt}$ and the data indicating the relationship between the ambient temperature Ta and the total $\Delta F_{total}$ of frequency variations in the oscillator circuit 100. The storage 50 may store, for example, the data indicating the relationship between the internal temperature $T_{thm}$ of the oscillator circuit 100 and the frequency variation $\Delta F_{xt1}$ due to a temperature change in the resonator 10. The storage 50 may store, in addition to the above data, any data used in an operation of the oscillator circuit 100. These data may be input to the storage 50 from the control part 200 via the interface 60. The various data stored in the storage 50 are preferably used as appropriate.

The interface 60 is provided between the storage 50 and the control part 200 and provides a communication interface. The interface 60 may be, for example, a serial interface such as an inter-integrated circuit (I2C) interface or a serial peripheral interface (SPI) interface.

The control part 200 sets various data. For example, the control part 200 sets the resistance value of the variable resistance $R_{IC}$. For example, the control part 200 sets output gain of a target temperature generation circuit and output gain of two temperature compensation voltage generation circuits. The control part 200 outputs various data to the storage 50 via the interface 60. Through a test path for monitoring by a temperature sensor, it is possible to monitor the voltage Vh at the terminal RH, the internal temperature $T_{thm}$ of the oscillator circuit 100, the temperature $T_{IC}$ of the integrated circuit 40, the target temperature $T_{gt}$ or the like via the control part 200.

In the oscillator circuit 100 according to the first embodiment, appropriate temperature control is performed by use of the current generator 41, the first heater 20, the second heater 42, the first temperature detector 30 and so on. By use of two temperature compensation voltage generation circuits, the temperature compensation component for compensating for the frequency variation $\Delta F_{xt1}$ due to a temperature change in the resonator 10 and the frequency variation $\Delta F_{IC}$ due to a temperature change in the integrated circuit 40 is generated. Accordingly, not only in the heater-off region, but also in the heater-on region in which the temperature $T_{xt1}$ of the resonator 10, the temperature $T_{IC}$ of the integrated circuit 40, and the internal temperature $T_{thm}$ of the oscillator circuit 100 do not match each other, since the frequency variation due to a temperature change in the resonator 10 and the integrated circuit 40 can be sufficiently compensated for, the oscillator circuit 100 having high frequency stability can be realized.

[Operation of Oscillator Circuit]

Figure 7:
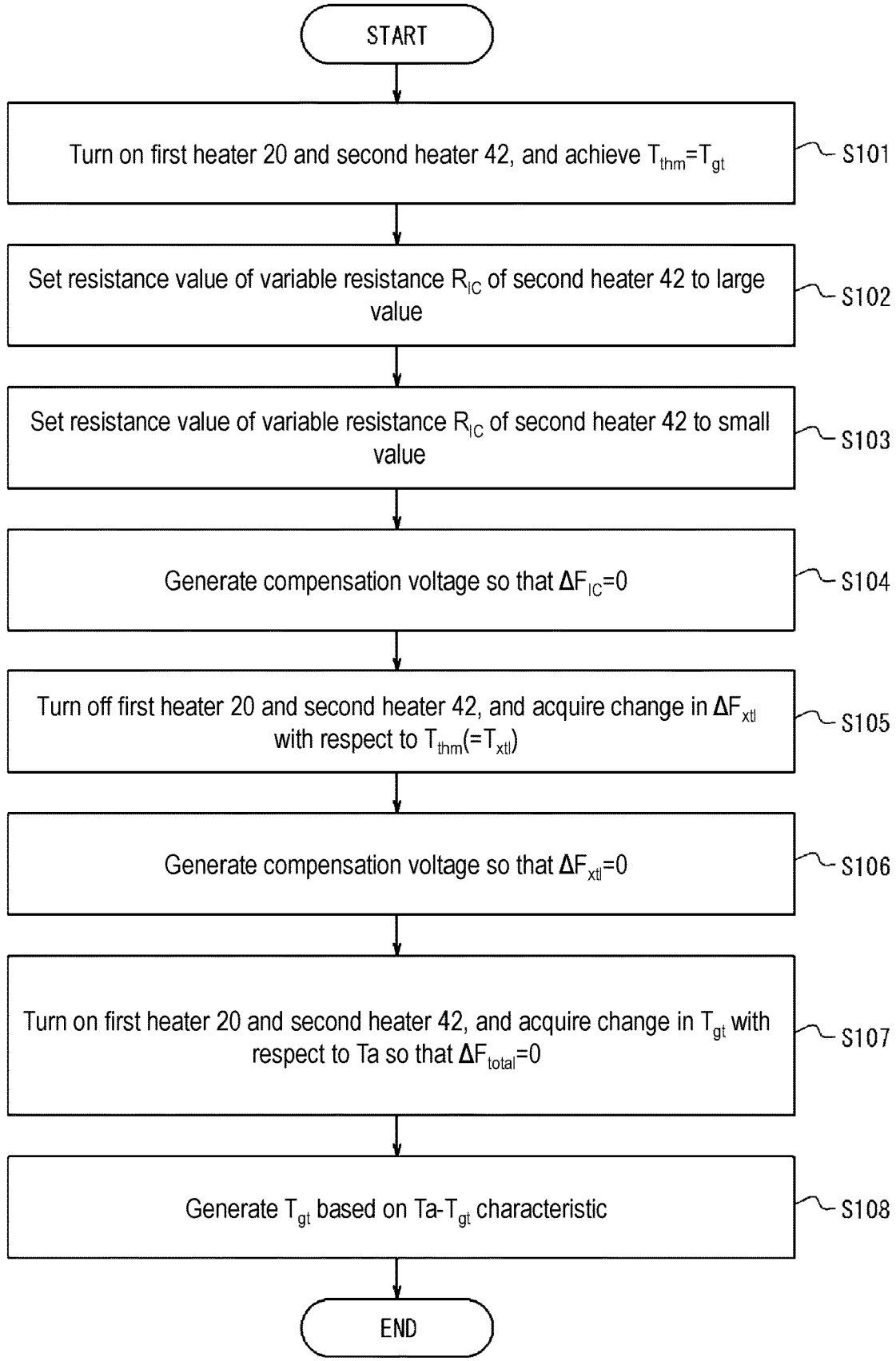
FIG. 7 is a flowchart illustrating an example of a temperature compensation method for the oscillator circuit according to the first embodiment.

An example of a temperature compensation method in the oscillator circuit 100 according to the first embodiment is described with reference to FIG. 7.

<Compensation for $\Delta F_{IC}$ in Heater-on Region>

In a heater-on region, a state is achieved in which the ambient temperature Ta is constant.

In step S101, the first heater 20 and the second heater 42 are turned on. The current generator 41 generates a heater current so that the internal temperature $T_{thm}$ of the oscillator circuit 100 matches the target temperature $T_{gt}$.

In step S102, in the second heater 42, a resistance value of the variable resistance $R_{IC}$ is set to a large value. The first temperature compensation voltage generation circuit 44 acquires data indicating the temperature $T_{IC1}$ of the integrated circuit 40 from the second temperature detector 43.

In step S103, in the second heater 42, the resistance value of the variable resistance $R_{IC}$ is set to a small value. The first temperature compensation voltage generation circuit 44 acquires data indicating the temperature $T_{IC2}$ of the integrated circuit 40 from the second temperature detector 43.

In step S104, based on the data indicating the frequency $F_1$ of the oscillation signal in the oscillator 46, the data indicating the internal temperature $T_{thm1}$ of the oscillator circuit 100, the data indicating the temperature $T_{IC1}$ of the integrated circuit 40, the data indicating the frequency $F_2$ of the oscillation signal in the oscillator 46, the data indicating the internal temperature $T_{thm2}$ of the oscillator circuit 100, and the data indicating the temperature $T_{IC2}$ of the integrated circuit 40, the first temperature compensation voltage generation circuit 44 generates the first compensation voltage $V_1$ so that the frequency variation $\Delta F_{IC}$ due to a temperature change in the integrated circuit 40 becomes zero.

Through the processing from step S101 to step S104 described above, the frequency variation $\Delta F_{IC}$ caused by a temperature variation factor of the integrated circuit 40 can be compensated for.

<Compensation for $\Delta F_{xt1}$ in Heater-off Region>

In a heater-off region, a state is achieved in which the ambient temperature Ta is changing.

In step S105, the first heater 20 and the second heater 42 are turned off. The second temperature compensation voltage generation circuit 45 acquires the data indicating the internal temperature $T_{thm}$ of the oscillator circuit 100 from the interface 47. The second temperature compensation voltage generation circuit 45 acquires, from the storage 50, the data indicating the relationship between the internal temperature $T_{thm}$ (=temperature $T_{xt1}$ of the resonator 10) of the oscillator circuit 100 and the frequency variation $\Delta F_{xt1}$ due to a temperature change in the resonator 10.

In step S106, based on the data indicating the frequency F of the oscillation signal in the oscillator 46, the data indicating the internal temperature $T_{thm}$ of the oscillator circuit 100, and a change in the frequency variation $\Delta F_{xt1}$ due to a temperature change in the resonator 10 with respect to the internal temperature $T_{thm}$ of the oscillator circuit 100, the second temperature compensation voltage generation circuit 45 generates the second compensation voltage $V_2$ so that the frequency variation $\Delta F_{xt1}$ due to a temperature change in the resonator 10 becomes zero.

Through the processing from step S105 to step S106 described above, the frequency variation $\Delta F_{xt1}$ due to a temperature change in the resonator 10 can be compensated for.

<Compensation for $\Delta F_{total}$ in Heater-On Region>

In a heater-on region, a state is achieved in which the ambient temperature Ta is changing.

In step S107, the first heater 20 and the second heater 42 are turned on. The target temperature generation circuit 411 acquires, from the storage 50, the data indicating the relationship (Ta–$T_{gt}$ characteristic) between the ambient temperature Ta and the target temperature $T_{gt}$ in the case where the target temperature $T_{gt}$ is calibrated so that the total $\Delta F_{total}$ of frequency variations in the oscillator circuit 100 becomes zero.

In step S108, based on the voltage Vh at the terminal RH that represents the ambient temperature Ta, the oscillator circuit 100 generates the target temperature $T_{gt}$ using the Ta–$T_{gt}$ characteristic.

Through the processing from step S107 to step S108 described above, even if $T_{xt1} \neq T_{thm}$ due to the occurrence of a temperature gradient starting from a heater, the total $\Delta F_{total}$ (=$\Delta F_{xt1} + \Delta F_{IC} - \Delta F_C$) of frequency variations in the oscillator circuit 100 can be compensated for.

By applying the temperature compensation method in the oscillator circuit 100 according to the first embodiment, the oscillator circuit 100 having high frequency stability can be realized.

Second Embodiment

An example of a temperature compensation method in the oscillator circuit 100 according to a second embodiment is described with reference to FIG. 8A to FIG. 10B.

The temperature compensation method in the oscillator circuit 100 according to the second embodiment differs from the temperature compensation method in the oscillator circuit 100 according to the first embodiment in that, in the temperature compensation method in the oscillator circuit 100 according to the second embodiment, the frequency variation $\Delta F_{xt1}$ due to a temperature change in the resonator 10 can be fully compensated for ($\Delta F_{xt1}=\Delta F_C$) at any ambient temperature. Since the other methods are the same as the temperature compensation method in the oscillator circuit 100 according to the first embodiment, repeated description is omitted.

An essential condition for full compensation for the frequency variation $\Delta F_{xt1}$ due to a temperature change in the resonator 10 at any ambient temperature includes that a boundary temperature Tz and a minimum temperature Tp match (Tz=Tp), which is hereinafter described. On a graph indicating the relationship between the temperature $T_{xt1}$ of the resonator 10 and the frequency variation $\Delta F_{xt1}$ due to a temperature change in the resonator 10, the minimum temperature Tp means the temperature $T_{xt1}$ of the resonator 10 when the frequency variation $\Delta F_{xt1}$ due to a temperature change in the resonator 10 is minimized.

Figure 8A:
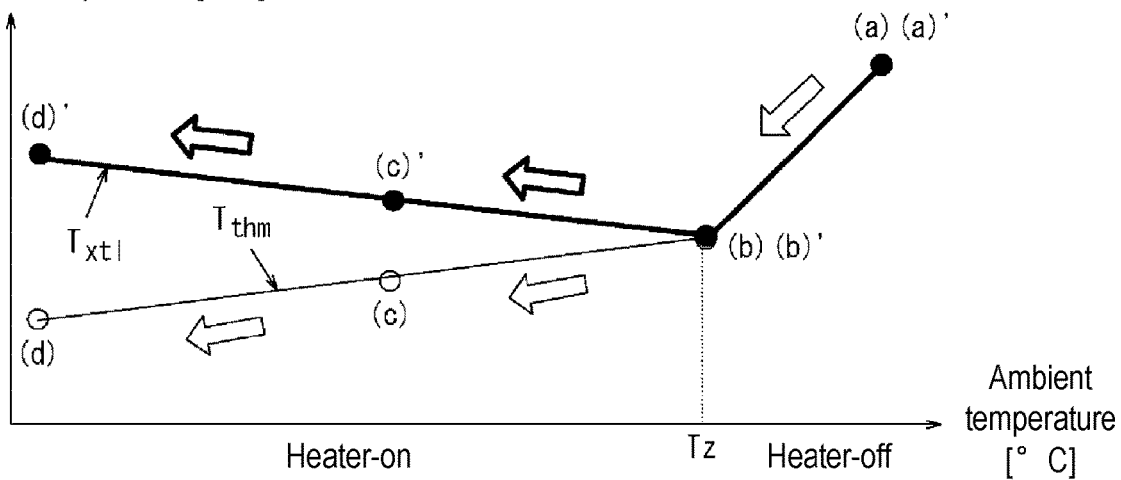
FIG. 8A illustrates an example of a relationship between ambient temperature and temperature of a resonator and a relationship between ambient temperature and internal temperature of an oscillator circuit according to a second embodiment.
Figure 8B:
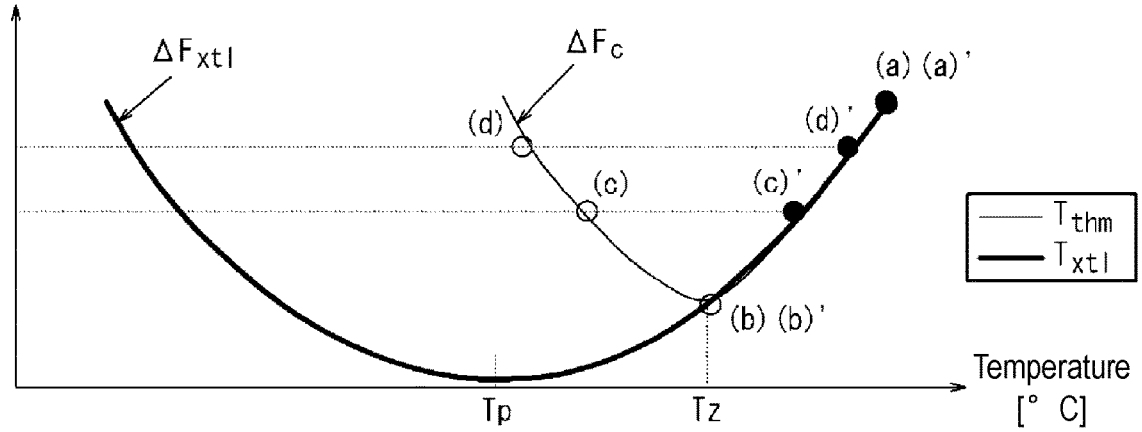
FIG. 8B illustrates an example of a relationship between temperature of the resonator and frequency variation due to a temperature change in the resonator and a relationship between internal temperature of the oscillator circuit and a temperature compensation component according to the second embodiment.

A solution to full compensation is not necessarily Tp=Tz, and a solution satisfying $\Delta F_{xt1}=\Delta F_C$ is searched for assuming that Tp~Tz. As shown in FIG. 8A and FIG. 8B, in all of (a)→(b)→(c)→(d) and (a)'→(b)'→(c)'→(d)', the equations are solved so that $\Delta F_{xt1}=\Delta F_C$ is established.

Around the minimum temperature Tp, the temperature $T_{xt1}$ of the resonator 10 becomes a temperature in a narrow range around the minimum temperature Tp due to temperature control in the oscillator circuit 100. Hence, the graph indicating the relationship between the temperature $T_{xt1}$ of the resonator 10 and the frequency variation $\Delta F_{xt1}$ due to a temperature change in the resonator 10 may be approximated by an even function (for example, a quadratic function). The frequency variation $\Delta F_{xt1}$ due to a temperature change in the resonator 10 may be expressed by the following equation.

$$\Delta F_{xt1}=A_2(T_{xt1}-Tp)^2 \quad (11)$$

In a heater-off region, a temperature compensation component may be optimally adjusted so that $\Delta F_{xt1}=\Delta F_C$ while a temperature gradient using a heater as a center becomes zero and $T_{xt1}=T_{thm}$.

When $\Delta F_{xt1}$ on the left side of equation (11) is replaced with $\Delta F_C$, and $T_{xt1}$ on the right side of equation (11) is replaced with $T_{thm}$, the temperature compensation component $\Delta F_C$ may be expressed by the following equation.

$$F_C=A_2(T_{thm}-Tp)^2 \quad (12)$$

Here, when it is considered to modify equation (12) into an equation regarding ($T_{thm}$-Tz) instead of an equation regarding ($T_{thm}$-Tp) and equation (12) is developed, the following equation may be obtained.

$$F_C=A_2(T_{thm}-Tp)^2=A_2(T_{ttm}^2-2TpT_{thm}+Tp^2) \quad (13)$$

When equation (13) is transformed into a quadratic equation regarding ($T_{thm}$-Tz), the following equation may be obtained.

$$F_C=A_2\{(T_{thm}-Tz)^2+2TzT_{thm}-Tz^2-2TpT_{thm}+Tp^2\} \quad (14)$$

The following equation may be obtained from equation (14).

$$\Delta F_C=A_2\{(T_{thm}-Tz)^2+2(Tz-Tp)(T_{thm}-Tz)+(Tz-Tp)^2\} \quad (15)$$

In order to establish $\Delta F_{xt1}=\Delta F_C$ at an arbitrary ambient temperature Ta in the heater-on region, the internal temperature $T_{thm}$ of the oscillator circuit 100 may be subjected to temperature control so as to satisfy $T_{thm}<Tz<T_{xt1}$. This is because the first heater 20 is closer to the resonator 10 than the first temperature detector 30 and $T_{xt1}>T_{thm}$ is always established in the heater-on region. With respect to an equation obtained by equating the right side of equation (11) with the right side of equation (14), when both sides are divided by $A_2$, the following equation may be obtained.

$$(T_{xt1}-Tp)^2=(T_{thm}-Tz)+2(Tz-Tp)(T_{thm}-Tz)+(Tz-Tp)^2 \quad (16)$$

Figure 9A:
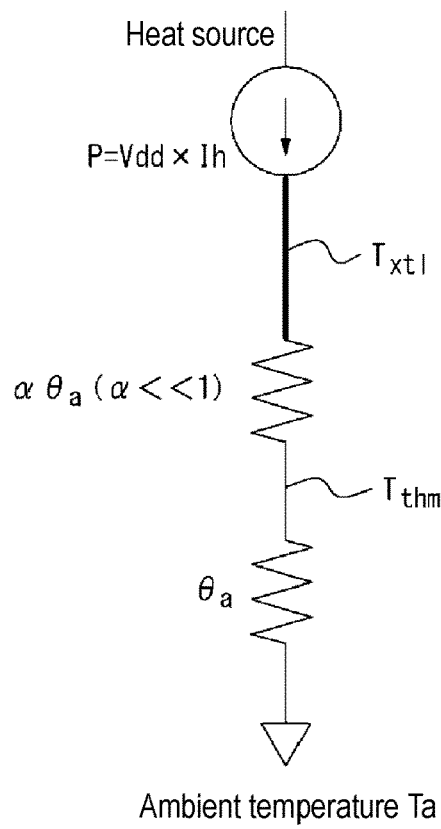
FIG. 9A illustrates an example of a thermal resistance model according to the second embodiment.
Figure 9B:
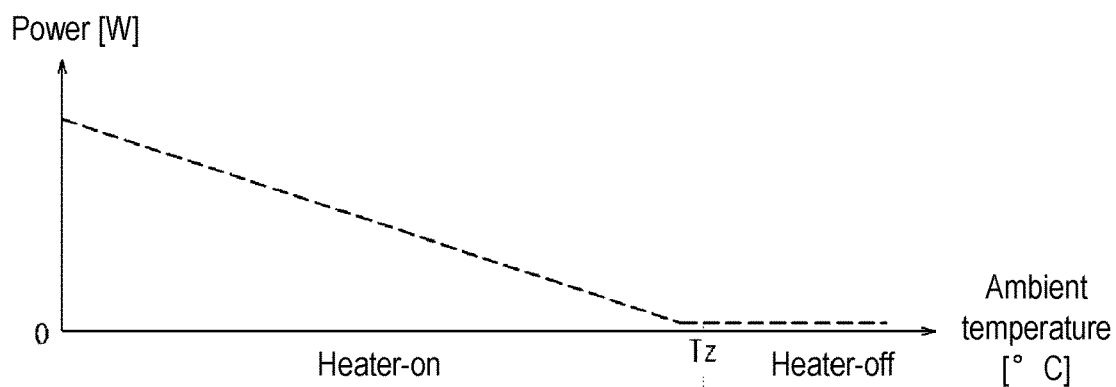
FIG. 9B illustrates an example of a relationship between ambient temperature and power according to the second embodiment.
Figure 9B:
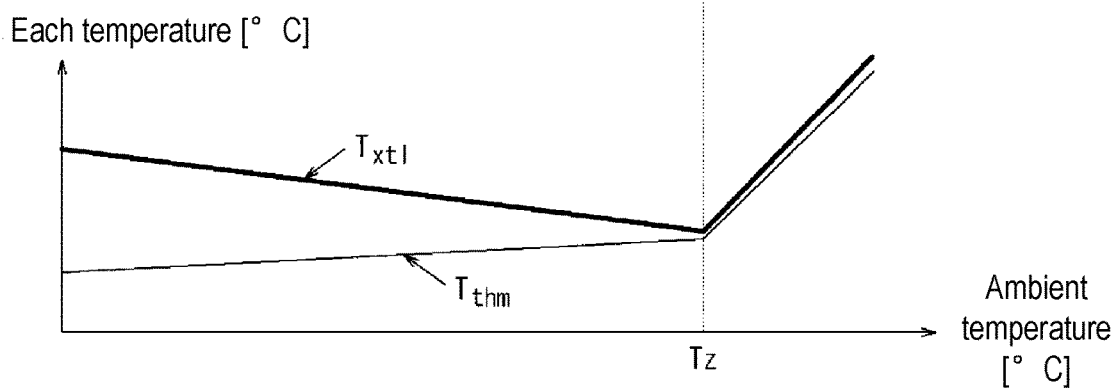

Here, the internal temperature $T_{thm}$ of the oscillator circuit 100, the temperature $T_{xt1}$ of the resonator 10, and the ambient temperature Ta are associated in a thermal resistance model, as shown in FIG. 9A and FIG. 9B.

From the thermal resistance model, since $(T_{thm}$-Ta): $(T_{xt1}-T_{thm})=\theta a:\alpha\times\theta a$ is established, the following equation may be obtained by solving $T_{xt1}$.

$$T_{xt1}=(1+\alpha)T_{thm}-\alpha Ta \text{(wherein } \alpha \text{ is a positive number sufficiently smaller than 1)} \quad (17)$$

When equation (17) is substituted into equation (16) and $T_{xt1}$ is eliminated, the following equation may be obtained.

$$\{(1+\alpha)T_{thm}-\alpha Ta-Tp\}^2=(T_{thm}-Tz)^2+2(Tz-Tp)(T_{thm}-Tz)+(Tz-Tp)^2 \quad (18)$$

When $T_{thm}$ is rearranged, the following equation may be obtained.

$$(1+\alpha)^2 T_{thm}^2-2(1+\alpha)(\alpha Ta+Tp)T_{thm}+(\alpha Ta+Tp)^2=T_{thm}^2-2TzT_{thm}+Tz^2+2(Tz-Tp)T_{thm}-2(Tz-Tp)Tz+(Tz-Tp)^2$$

$$\alpha(2+\alpha)T_{thm}^2-2\{\alpha Ta+\alpha(\alpha Ta+Tp)\}T_{thm}+(\alpha Ta+Tp)^2=Tz^2-2(Tz-Tp)Tz+(Tz-Tp)^2$$

$$\alpha(2+\alpha)T_{thm}^2-2\alpha\{(1+a)Ta+Tp\}T_{thm}+(\alpha Ta+Tp)^2=Tp^2$$

$$\alpha(2+a)T_{thm}^2-2\alpha[(1+\alpha)Ta+Tp]T_{thm}+\alpha(\alpha Ta+2Tp)Ta=0$$

$$(2+\alpha)T_{thm}^2-2\{(1+\alpha)Ta+Tp\}T_{thm}+(\alpha Ta+2Tp)Ta=0 \quad (19)$$

Since equation (19) is a quadratic equation regarding the internal temperature $T_{thm}$ of the oscillator circuit 100, when equation (19) is solved, the following equation may be obtained.

$$T_{thm} = \frac{(1+\alpha)Ta+Tp \pm \sqrt{\{(1+\alpha)Ta+Tp\}^2-(2+\alpha)(\alpha Ta+2Tp)Ta}}{2+\alpha} = \frac{(1+\alpha)Ta+Tp \pm \sqrt{Ta^2-2TpTa+Tp^2}}{2+\alpha} = \frac{(1+\alpha)Ta+Tp \pm |Ta-Tp|}{2+\alpha} \quad (20)$$

One of the two solutions is the case where ± is set to + in equation (20), and $T_{thm}$=Ta is satisfied. However, this indicates that the internal temperature $T_{thm}$ matches the ambient temperature Ta and the amount of heat generated by the heater is zero. That is, it contradicts the fact that the heater is on, and cannot be an actual solution. The other solution is a solution to be obtained, and the following equation may be obtained.

$$T_{thm} = \frac{\alpha}{2+\alpha}Ta + \frac{2}{2+\alpha}Tp \quad (21)$$

When equation (21) is substituted into equation (17), the following equation may be obtained.

$$T_{xtl} = -\frac{\alpha}{2+\alpha}Ta + \frac{2+2\alpha}{2+\alpha}Tp \quad (22)$$

From equations (21) and (22), an average value of the internal temperature $T_{thm}$ of the oscillator circuit 100 and the temperature $T_{xt1}$ of the resonator 10 may be expressed by the following equation.

$$\frac{1}{2}(T_{thm} + T_{xt1}) = Tp \tag{23}$$

Figure 10A:
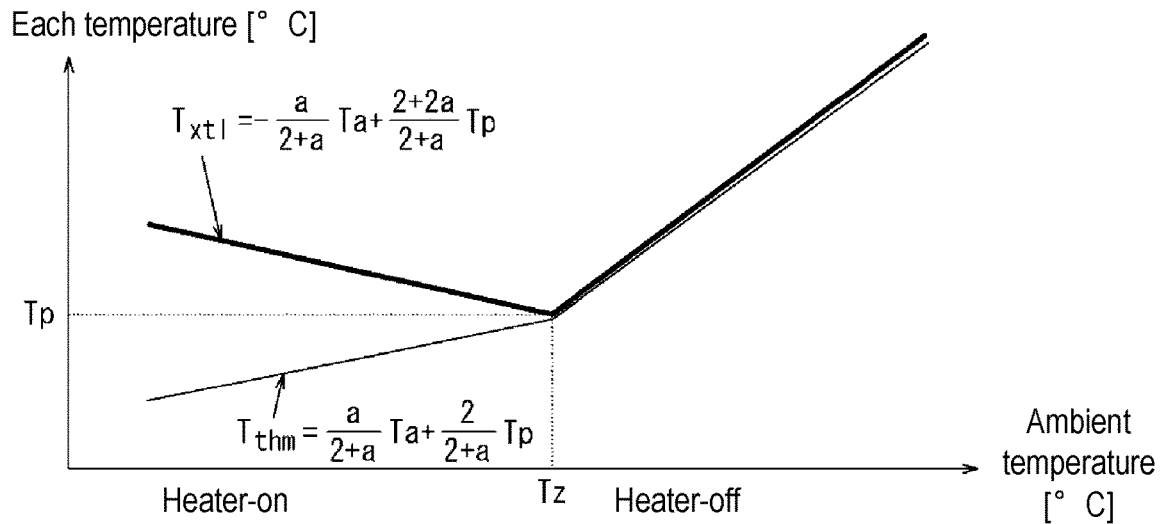
FIG. 10A illustrates an example of a relationship between ambient temperature and temperature of the resonator and a relationship between ambient temperature and internal temperature of the oscillator circuit according to the second embodiment.

As shown in FIG. 10A, a slope of the internal temperature $T_{thm}$ of the oscillator circuit 100 with respect to the ambient temperature Ta and a slope of the temperature $T_{xt1}$ of the resonator 10 with respect to the ambient temperature Ta have the same absolute value and opposite polarities.

Figure 10B:
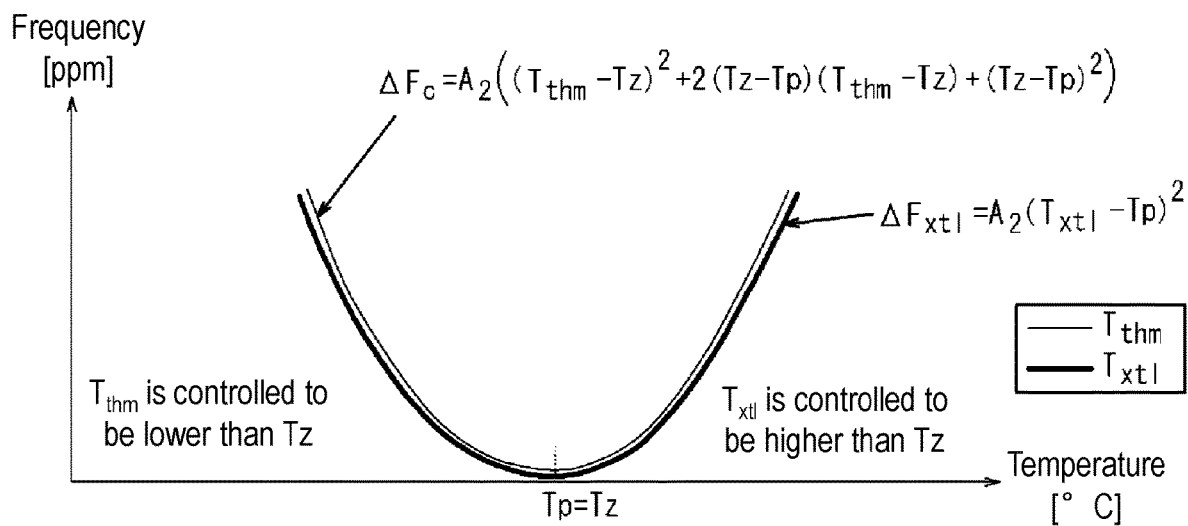
FIG. 10B illustrates an example of a relationship between temperature of the resonator and frequency variation due to a temperature change in the resonator and a relationship between internal temperature of the oscillator circuit and a temperature compensation component according to the second embodiment.

Accordingly, as shown in FIG. 10B, it is known that, in order to fully compensate for ($\Delta F_{xt1} = \Delta F_C$) the frequency variation $\Delta F_{xt1}$ due to a temperature change in the resonator 10 at any ambient temperature, the boundary temperature Tz and the minimum temperature Tp match (Tz=Tp). In the oscillator circuit 100, temperature control may be performed to control the internal temperature $T_{thm}$ of the oscillator circuit 100 to be first order with respect to the ambient temperature Ta while the boundary temperature Tz and the minimum temperature Tp match.

According to the temperature compensation method in the oscillator circuit 100 according to the second embodiment, the frequency variation $\Delta F_{xt1}$ due to a temperature change in the resonator 10 can be fully compensated for at any ambient temperature. Accordingly, the oscillator circuit 100 having very high frequency stability can be realized.

Third Embodiment

An example of a temperature compensation method in the oscillator circuit 100 according to a third embodiment is described with reference to FIG. 11 and FIG. 12.

The temperature compensation method in the oscillator circuit 100 according to the third embodiment differs from the temperature compensation method in the oscillator circuit 100 according to the second embodiment in that, in the temperature compensation method in the oscillator circuit 100 according to the third embodiment, the boundary temperature Tz and the minimum temperature Tp do not match. Since the other methods are the same as the temperature compensation method in the oscillator circuit 100 according to the second embodiment, repeated description is omitted.

A method for compensating for the frequency variation $\Delta F_{xt1}$ due to a temperature change in the resonator 10 in the case where the boundary temperature Tz and the minimum temperature Tp do not match is described.

Figure 11:
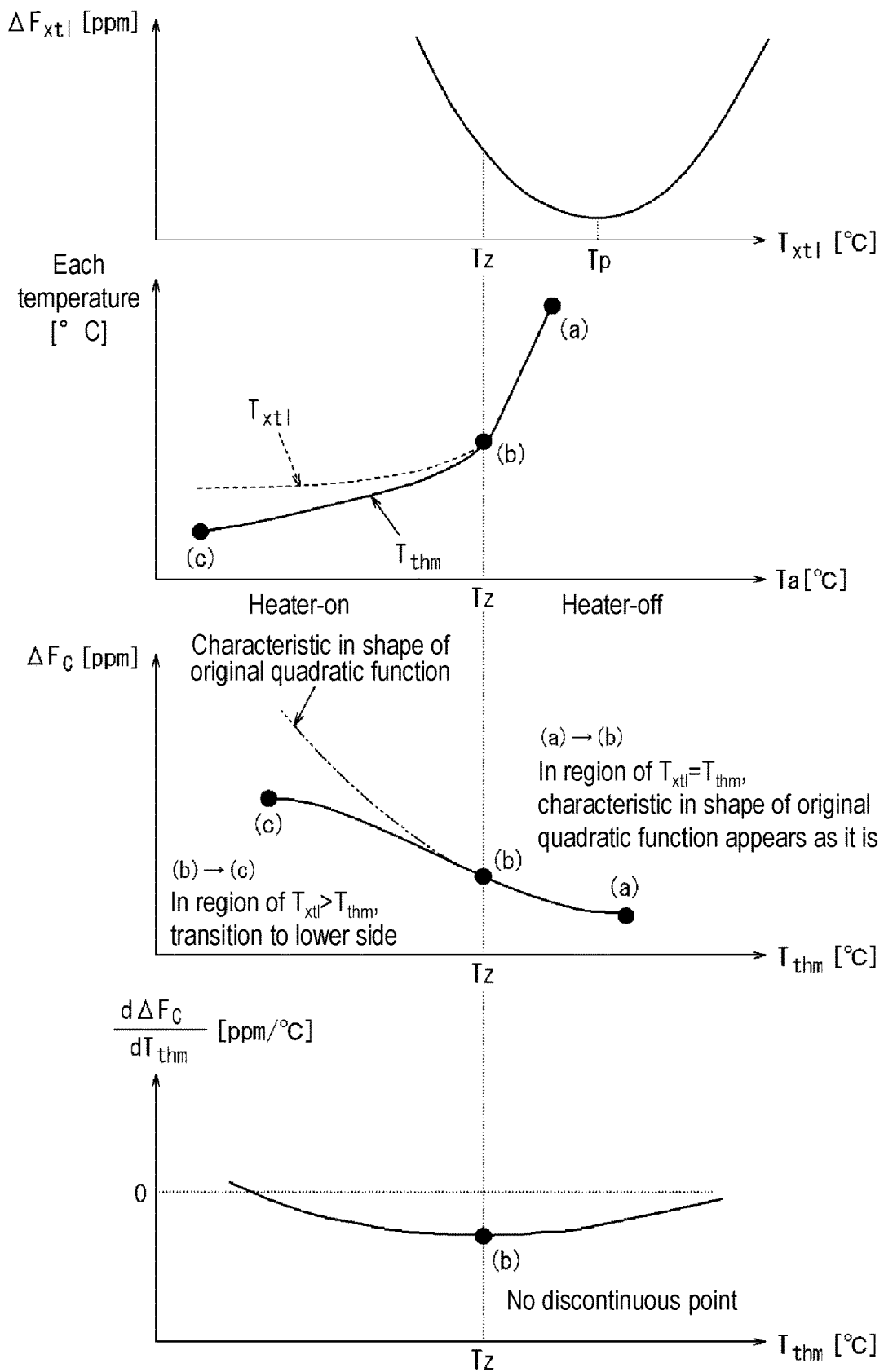
FIG. 11 illustrates an example of how temperature compensation is performed when no discontinuous point occurs according to a third embodiment.

As shown in FIG. 11, in the heater-off region ((a)→(b)), in the oscillator circuit 100, the temperature compensation component $\Delta F_C$ for compensating for the frequency variation $\Delta F_{xt1}$ due to a temperature change in the resonator 10 is generated.

As shown in FIG. 11, in the heater-on region ((b)→(c)), in the oscillator circuit 100, the internal temperature $T_{thm}$ of the oscillator circuit 100 is subjected to temperature control so that, a graph indicating the relationship between the internal temperature $T_{thm}$ of the oscillator circuit 100 and the frequency variation $\Delta F_{xt1}$ due to a temperature change in the resonator 10 achieves a smooth function (for example, a cubic function) at point (b) where the internal temperature $T_{thm}$ of the oscillator circuit 100 reaches the boundary temperature Tz. Then, in the oscillator circuit 100, the temperature compensation component $\Delta F_C$ is generated based on the aforesaid function.

Figure 12:
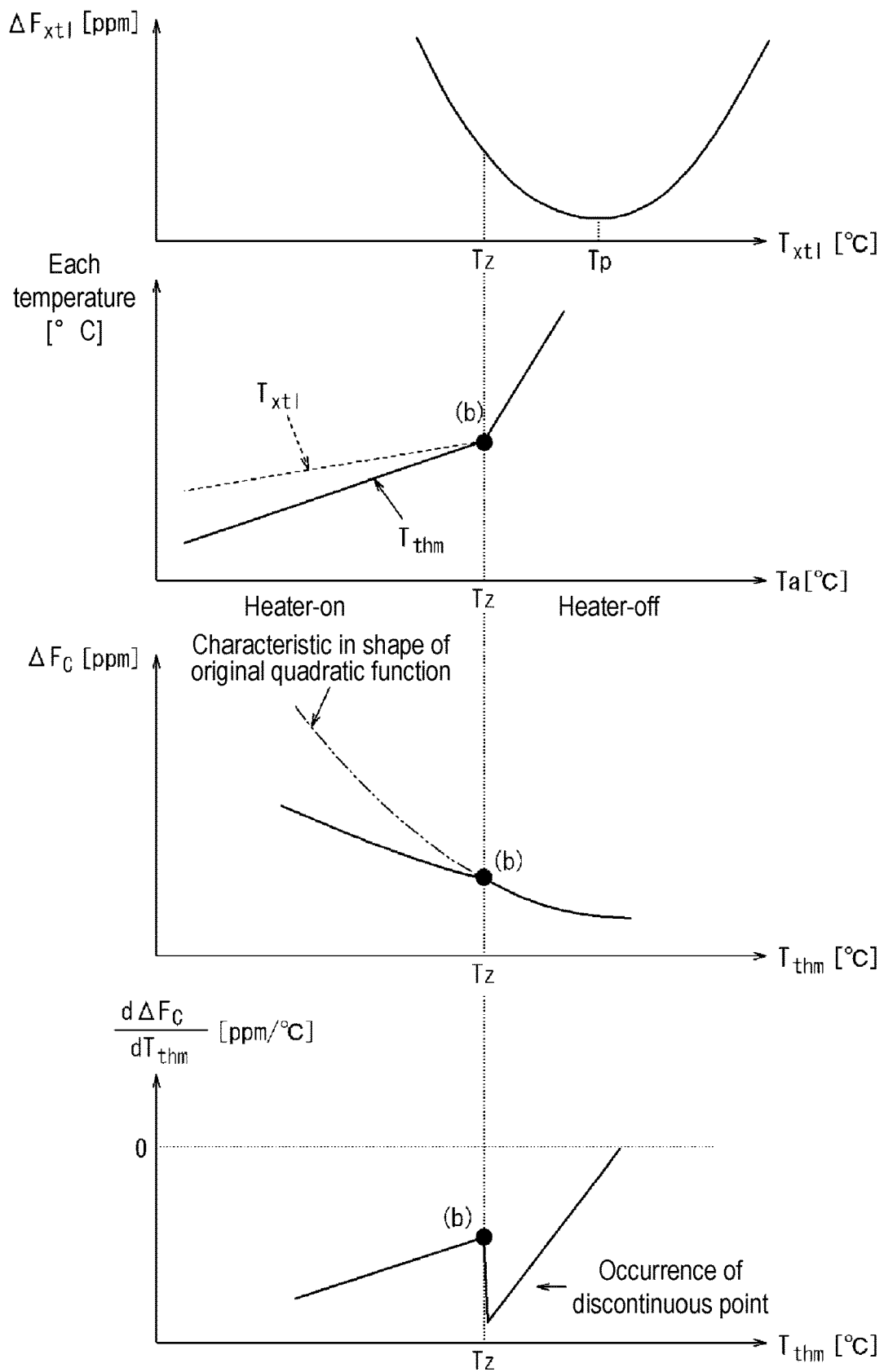
FIG. 12 illustrates an example of how temperature compensation is performed when a discontinuous point occurs according to the third embodiment.

As shown in FIG. 12, on a graph indicating a relationship between the internal temperature $T_{thm}$ of the oscillator circuit 100 and a slope $d\Delta F_C/dT_{thm}$, when a discontinuous point occurs at the slope $d\Delta F_C/dT_{thm}$ where the internal temperature $T_{thm}$ of the oscillator circuit 100 reaches the boundary temperature Tz, after temperature compensation, a problem, such as occurrence of a large residual error component or deterioration of frequency stability due to a temperature change, may occur. However, according to the temperature compensation method in the oscillator circuit 100 according to the third embodiment, as shown in FIG. 11, on the graph indicating the relationship between the internal temperature $T_{thm}$ of the oscillator circuit 100 and the slope $d\Delta F_C/dT_{thm}$, since no discontinuous point occurs at the slope $d\Delta F_C/dT_{thm}$ where the internal temperature $T_{thm}$ of the oscillator circuit 100 reaches the boundary temperature Tz, such a problem can be avoided.

In the third embodiment, a case where the minimum temperature Tp is higher than the boundary temperature Tz has been described as an example. However, even if the minimum temperature Tp is equal to or lower than the boundary temperature Tz, it is of course possible to apply the same temperature compensation method.

According to the temperature compensation method in the oscillator circuit 100 according to the third embodiment, even if the boundary temperature Tz and the minimum temperature Tp do not match, the total $\Delta F_{total}(=\Delta F_{xt1}-\Delta F_C)$ of frequency variations in the oscillator circuit 100 can be made zero. Accordingly, since resistance to individual differences in the minimum temperature Tp is enhanced, mass productivity can be improved.

Fourth Embodiment

An example of a temperature compensation method in the oscillator circuit 100 according to a fourth embodiment is described with reference to FIG. 13A and FIG. 13B.

The temperature compensation method in the oscillator circuit 100 according to the fourth embodiment differs from the temperature compensation method in the oscillator circuit 100 according to the third embodiment in that, in the temperature compensation method in the oscillator circuit 100 according to the fourth embodiment, the boundary temperature Tz matches an ambient temperature maximum value Ta_MAX. Since the other methods are the same as the temperature compensation method in the oscillator circuit 100 according to the third embodiment, repeated description is omitted.

Figure 13A:
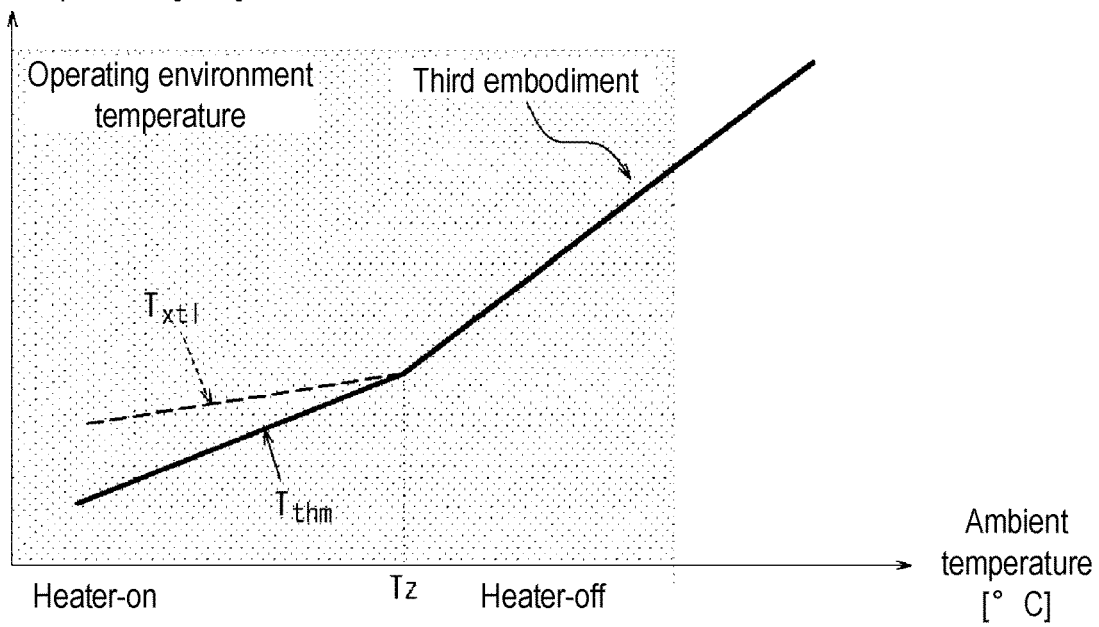
FIG. 13A illustrates an example of a relationship between ambient temperature and temperature of a resonator and a relationship between ambient temperature and internal temperature of an oscillator circuit according to the third embodiment.

As shown in FIG. 13A, in the temperature compensation method in the oscillator circuit 100 according to the third embodiment, the boundary temperature Tz is set to be lower than the ambient temperature maximum value Ta_MAX.

Figure 13B:
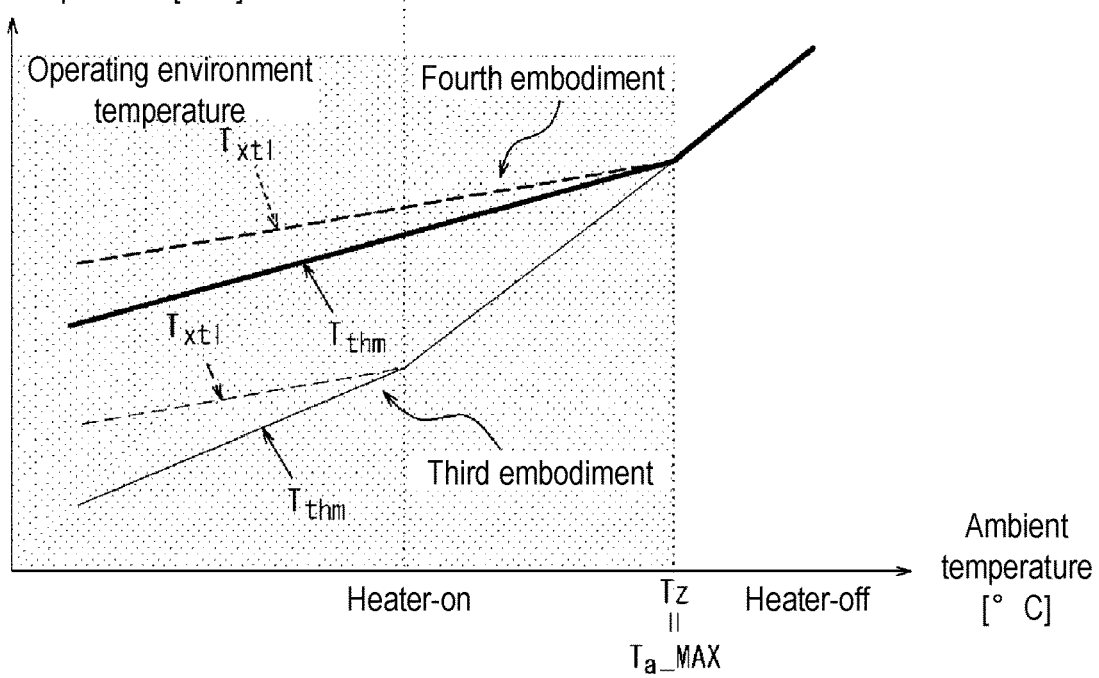
FIG. 13B illustrates an example of a relationship between ambient temperature and temperature of a resonator and a relationship between ambient temperature and internal temperature of an oscillator circuit according to a fourth embodiment.
Figure 14:
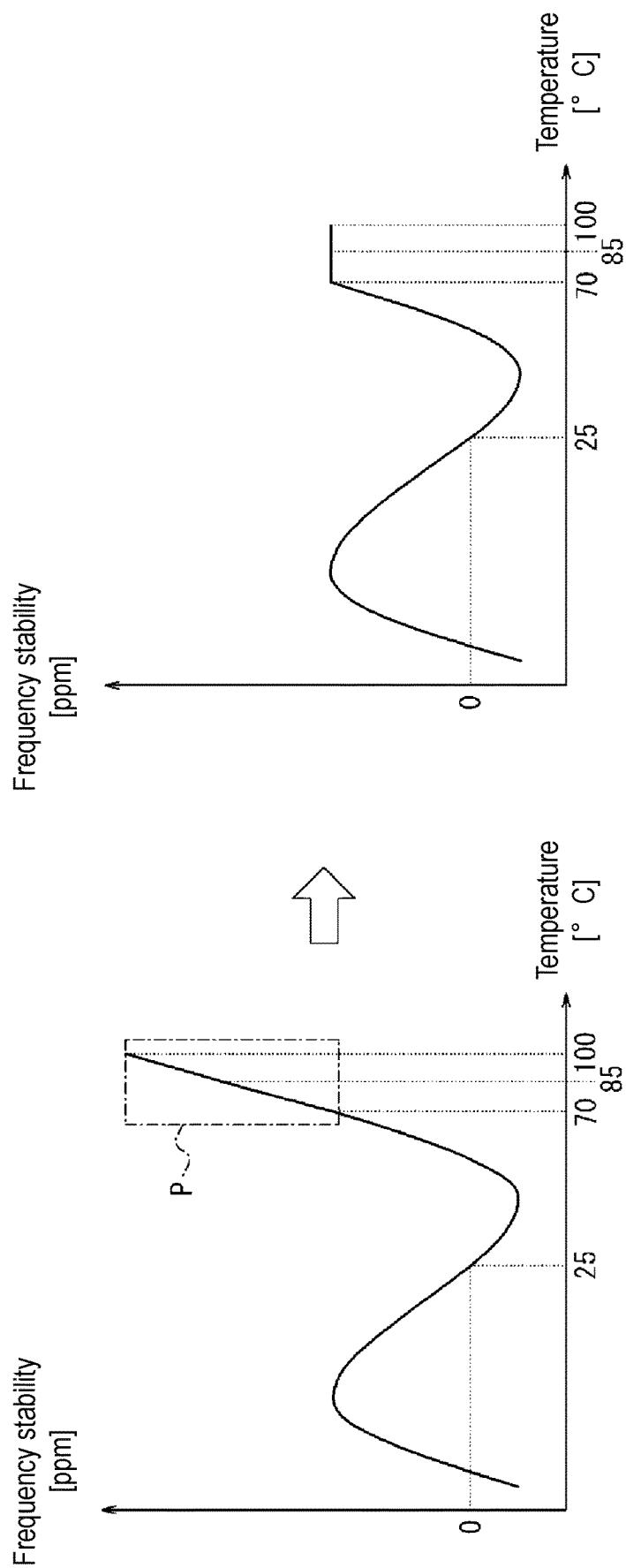
FIG. 14 illustrates an example of a relationship between temperature and frequency stability of a conventional crystal resonator.

On the other hand, as shown in FIG. 13B, in the temperature compensation method in the oscillator circuit 100 according to the fourth embodiment, the boundary temperature Tz is set to match the ambient temperature maximum value Ta_MAX.

According to the temperature compensation method in the oscillator circuit 100 according to the fourth embodiment, by causing the boundary temperature Tz to match the ambient temperature maximum value Ta_MAX, an operation is performed only in the heater-on region at an ambient temperature at which normal operation is performed. Since fine adjustment of the internal temperature $T_{thm}$ of the oscillator circuit 100 in the vicinity of the boundary tem-

Fifth Embodiment

In a fifth embodiment, an estimation method for estimating the temperature $T_{xt1}$ of the resonator 10 at an arbitrary ambient temperature Ta by use of the frequency variation $\Delta F_{xt1}$ due to a temperature change in the resonator 10 is described.

First, in regard to compensation for the frequency variation $\Delta F_{IC}$ due to a temperature change in the integrated circuit 40, the oscillator circuit 100 performs the same temperature compensation as in the first embodiment.

Next, the oscillator circuit 100 measures the frequency variation $\Delta F_{xt1}$ due to a temperature change in the resonator 10 in the heater-off region and at the ambient temperature Ta that is changing. Meanwhile, the oscillator circuit 100 measures the temperature $T_{IC}$ of the integrated circuit 40 and the internal temperature $T_{thm}$ of the oscillator circuit 100 ($T_{IC}=T_{xt1}=T_{thm}$), and calculates an approximation function such as an N-th order function based on the relationship between the temperature $T_{xt1}$ of the resonator 10 and the frequency variation $\Delta F_{xt1}$ due to a temperature change in the resonator 10.

Next, the oscillator circuit 100 measures the frequency variation $\Delta F_{xt1}$ due to a temperature change in the resonator 10 in the heater-on region at an ambient temperature minimum value Ta_min, and calculates the temperature Txti of the resonator 10 based on the calculated approximation function. Meanwhile, the oscillator circuit 100 measures the internal temperature $T_{thm}$ of the oscillator circuit 100, and calculates a thermal resistance ratio α by using the following equation derived from the thermal resistance model (see FIG. 9A).

$$T_{xt1}=(1+\alpha)T_{thm}-\alpha Ta \tag{24}$$

A reason to use the ambient temperature minimum value Ta_min is that the thermal resistance ratio α can be calculated with high accuracy since a difference between the internal temperature $T_{thm}$ of the oscillator circuit 100 and the ambient temperature Ta and a difference between the temperature $T_{xt1}$ of the resonator 10 and the ambient temperature Ta become largest.

In the oscillator circuit 100, by using the thermal resistance ratio α calculated based on equation (24), the temperature $T_{xt1}$ of the resonator 10 at an arbitrary ambient temperature Ta can be calculated. Further, in the oscillator circuit 100, by using the approximation function calculated based on the relationship between the temperature $T_{xt1}$ of the resonator 10 and the frequency variation $\Delta F_{xt1}$ due to a temperature change in the resonator 10, the frequency variation $\Delta F_{xt1}$ due to a temperature change in the resonator 10 at an arbitrary ambient temperature Ta can also be calculated.

According to the estimation method according to the fifth embodiment, the temperature $T_{xt1}$ of the resonator 10 at an arbitrary ambient temperature Ta can be estimated. By applying the estimation method according to the fifth embodiment to the temperature compensation method in the oscillator circuit 100 according to each embodiment described above, the oscillator circuit 100 is able to easily perform temperature control of the internal temperature $T_{thm}$ of the oscillator circuit 100.

<Modifications>

In each embodiment described above, an example has been described in which the integrated circuit 40 is configured to include the current generator 41, the second heater 42, the second temperature detector 43, the first temperature compensation voltage generation circuit 44, the second temperature compensation voltage generation circuit 45, the oscillator 46, the interface 47, the storage 50, and the interface 60. However, the integrated circuit 40 is not limited to the above configuration.

For example, the integrated circuit 40 may be configured to include the current generator 41, the second heater 42, the second temperature detector 43, the first temperature compensation voltage generation circuit 44, the oscillator 46 and the interface 47. In the case where the integrated circuit 40 has the above configuration, the oscillator circuit 100 is able to perform temperature compensation so that the frequency variation $\Delta F_{IC}$ due to a temperature change in the integrated circuit 40 is zero.

Although the above embodiments have been described as representative examples, it will be apparent to those skilled in the art that many modifications and substitutions may be made within the spirit and scope of the disclosure. Accordingly, the present disclosure should not be construed as limited by the embodiments described above, and various modifications and changes are possible without departing from the scope of the appended claims. For example, it is possible to combine a plurality of configuration blocks described in the configuration diagrams of the embodiments into one, or to divide one configuration block. It is possible to combine a plurality of steps described in the flowcharts of the embodiments into one, or to divide one step.

What is claimed is:

1. An oscillator circuit that compensates for a frequency variation due to a temperature change in a resonator and a temperature change in an integrated circuit provided in the oscillator circuit, the oscillator circuit comprising:
   a first temperature detector, detecting an internal temperature of the oscillator circuit;
   a first heater, heating the resonator based on a heater current; and
   the integrated circuit,
   the integrated circuit further comprising:
   a current generator, generating the heater current so that the internal temperature matches a target temperature;
   a second heater, heating the integrated circuit based on the heater current;
   a second temperature detector, detecting a temperature of the integrated circuit;
   a first compensation voltage generation circuit, generating a first compensation voltage for compensating for a first frequency variation due to the temperature change in the integrated circuit, based on a detection result of the second temperature detector;
   a second compensation voltage generation circuit, generating a second compensation voltage for compensating for a second frequency variation due to the temperature change in the resonator, based on a detection result of the first temperature detector; and
   an oscillator, generating an oscillation signal based on the first compensation voltage and the second compensation voltage.

2. The oscillator circuit according to claim 1, wherein the second heater is a variable resistor whose resistance value changes.

3. The oscillator circuit according to claim 1, wherein the current generator comprises a target temperature generation circuit that generates the target temperature based on an output voltage of the current generator.

4. The oscillator circuit according to claim 1, wherein, on a graph indicating a relationship between a temperature of the resonator and the second frequency variation, a boundary temperature matches a minimum temperature being the temperature of the resonator at which the second frequency variation becomes minimum; and the second compensation voltage generation circuit generates the second compensation voltage so that the second frequency variation becomes zero.

5. The oscillator circuit according to claim 2, wherein,
on a graph indicating a relationship between a temperature of the resonator and the second frequency variation, a boundary temperature matches a minimum temperature being the temperature of the resonator at which the second frequency variation becomes minimum; and the second compensation voltage generation circuit generates the second compensation voltage so that the second frequency variation becomes zero.

6. The oscillator circuit according to claim 1, wherein,
on a graph indicating a relationship between a temperature of the resonator and the second frequency variation, a boundary temperature does not match a minimum temperature being the temperature of the resonator at which the second frequency variation becomes minimum; and the second compensation voltage generation circuit generates the second compensation voltage so that the second frequency variation becomes zero.

7. The oscillator circuit according to claim 2, wherein,
on a graph indicating a relationship between a temperature of the resonator and the second frequency variation, a boundary temperature does not match a minimum temperature being the temperature of the resonator at which the second frequency variation becomes minimum; and the second compensation voltage generation circuit generates the second compensation voltage so that the second frequency variation becomes zero.

8. The oscillator circuit according to claim 4, wherein the boundary temperature matches a maximum value of an ambient temperature.

9. The oscillator circuit according to claim 6, wherein the boundary temperature matches a maximum value of an ambient temperature.

10. An oscillator circuit that compensates for a frequency variation due to a temperature change in a resonator and a temperature change in an integrated circuit provided in the oscillator circuit, the oscillator circuit comprising:
a first temperature detector, detecting an internal temperature of the oscillator circuit;
a current generator, generating a heater current so that the internal temperature matches a target temperature;
a first heater, heating the resonator based on the heater current;
a second heater, being a variable resistor whose resistance value changes, and heating the integrated circuit based on the heater current;
a second temperature detector, detecting a temperature of the integrated circuit;
a compensation voltage generation circuit, generating a compensation voltage for compensating for a frequency variation due to the temperature change in the integrated circuit, based on a detection result of the second temperature detector; and
an oscillator, generating an oscillation signal based on the compensation voltage, wherein the current generator comprises a target temperature generation circuit that generates the target temperature based on an output voltage of the current generator.

11. The oscillator circuit according to claim 10, wherein the current generator comprises the target temperature generation circuit that, in a heater-on region and at an ambient temperature that is changing, generates the target temperature so as to compensate for a frequency variation with respect to the ambient temperature.

12. A temperature control circuit, provided in an oscillator circuit that compensates for a frequency variation due to a temperature change in a resonator and an integrated circuit, the temperature control circuit comprising:
a first temperature detector, detecting an internal temperature of the oscillator circuit;
a current generator, generating a heater current so that the internal temperature matches a target temperature, and, in a heater-on region and at an ambient temperature that is changing, generating the target temperature so as to compensate for a frequency variation due to the temperature change in the resonator with respect to the ambient temperature;
a first heater, heating the resonator based on the heater current; and
a second heater, heating the integrated circuit based on the heater current,
wherein the current generator comprises a target temperature generation circuit that generates the target temperature based on an output voltage of the current generator.

13. The temperature control circuit according to claim 12, wherein
the second heater is a variable resistor whose resistance value changes.

14. The temperature control circuit according to claim 12, wherein
the current generator comprises the target temperature generation circuit that, in the heater-on region and at the ambient temperature that is changing, generates the target temperature so as to compensate for a frequency variation with respect to the ambient temperature.

15. A temperature compensation method for an oscillator circuit, the oscillator circuit compensating for a frequency variation due to a temperature change in a resonator and a temperature change in an integrated circuit and comprising:
a first temperature detector, detecting an internal temperature of the oscillator circuit;
a current generator, generating a heater current so that the internal temperature matches a target temperature;
a first heater, heating the resonator based on the heater current;
a second heater, heating the integrated circuit based on the heater current;
a second temperature detector, detecting a temperature of the integrated circuit;
a first compensation voltage generation circuit, generating a first compensation voltage for compensating for a first frequency variation due to the temperature change in the integrated circuit, based on a detection result of the second temperature detector;
a second compensation voltage generation circuit, generating a second compensation voltage for compensating for a second frequency variation due to the temperature change in the resonator, based on a detection result of the first temperature detector; and an oscillator, generating an oscillation signal based on the first compensation voltage and the second compensation voltage, wherein the temperature compensation method comprises:

by the current generator, generating the heater current so that the internal temperature matches the target temperature in a heater-on region and at an ambient temperature that is constant;

setting a resistance value of a variable resistance of the second heater to a first resistance value and detecting the temperature of the integrated circuit;

setting the resistance value of the variable resistance of the second heater to a second resistance value less than the first resistance value and detecting the temperature of the integrated circuit;

by the first compensation voltage generation circuit, generating the first compensation voltage for compensating for the first frequency variation based on the temperature of the integrated circuit at which the resistance value is the first resistance value and the temperature of the integrated circuit at which the resistance value is the second resistance value;

by the second compensation voltage generation circuit, generating the second compensation voltage for compensating for the second frequency variation based on a change in the second frequency variation with respect to the internal temperature in a heater-off region and at the ambient temperature that is changing; and by the current generator, generating the target temperature so as to compensate for the second frequency variation with respect to the ambient temperature in the heater-on region and at the ambient temperature that is changing.

16. The temperature compensation method according to claim 15, further comprising:

in the heater-on region and at the ambient temperature that is changing, generating the target temperature so as to compensate for the second frequency variation with respect to the ambient temperature.

17. The temperature compensation method according to claim 15, further comprising:

on a graph indicating a relationship between a temperature of the resonator and the second frequency variation, causing a boundary temperature to match a minimum temperature being the temperature of the resonator at which the second frequency variation becomes minimum; and generating the second compensation voltage so that the second frequency variation becomes zero.

18. The temperature compensation method according to claim 17, wherein the boundary temperature matches a maximum value of the ambient temperature.

19. An oscillator circuit that compensates for a frequency variation due to a temperature change in a resonator and a temperature change in an integrated circuit, the oscillator circuit comprising:

a first temperature detector, detecting an internal temperature of the oscillator circuit;

a current generator, generating a heater current so that the internal temperature matches a target temperature;

a first heater, heating the resonator based on the heater current;

a second heater, being a variable resistor whose resistance value changes, and heating the integrated circuit based on the heater current;

a second temperature detector, detecting a temperature of the integrated circuit;

a compensation voltage generation circuit, generating a compensation voltage for compensating for a frequency variation due to the temperature change in the integrated circuit, based on a detection result of the second temperature detector; and an oscillator, generating an oscillation signal based on the compensation voltage, wherein on a graph indicating a relationship between a temperature of the resonator and the frequency variation, a boundary temperature matches a minimum temperature being the temperature of the resonator at which the frequency variation becomes minimum; and the compensation voltage generation circuit generates the compensation voltage so that the frequency variation becomes zero.

* * * * *